(12) United States Patent
Miura

(10) Patent No.: US 12,317,614 B2
(45) Date of Patent: May 27, 2025

(54) SEMICONDUCTOR DEVICE AND ELECTRONIC APPARATUS INCLUDING PN JUNCTION PORTIONS

(71) Applicant: SONY SEMICONDUCTOR SOLUTIONS CORPORATION, Kanagawa (JP)

(72) Inventor: Takahiro Miura, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 384 days.

(21) Appl. No.: 17/757,038

(22) PCT Filed: Oct. 28, 2020

(86) PCT No.: PCT/JP2020/040534
§ 371 (c)(1),
(2) Date: Jun. 8, 2022

(87) PCT Pub. No.: WO2021/124697
PCT Pub. Date: Jun. 24, 2021

(65) Prior Publication Data
US 2023/0011366 A1    Jan. 12, 2023

(30) Foreign Application Priority Data
Dec. 16, 2019  (JP) .................. 2019-226244

(51) Int. Cl.
*H10F 39/18* (2025.01)
*G01S 17/894* (2020.01)
(Continued)

(52) U.S. Cl.
CPC ............ *H10F 39/18* (2025.01); *G01S 17/894* (2020.01); *H10F 30/225* (2025.01); *H10F 39/807* (2025.01); *H10F 39/811* (2025.01)

(58) Field of Classification Search
CPC ........... H01L 27/14643; H01L 27/1463; H01L 27/14636; H01L 31/107; G01S 17/894
See application file for complete search history.

(56) References Cited

U.S. PATENT DOCUMENTS

| 12,113,137 B2* | 10/2024 | Ayel ............... H01L 31/022408 |
| 2011/0272561 A1* | 11/2011 | Sanfilippo ....... H01L 31/022408 |
| | | 438/73 |

(Continued)

FOREIGN PATENT DOCUMENTS

| JP | 2010-103221 A | 5/2010 |
| JP | 2013-511854 A | 4/2013 |

(Continued)

OTHER PUBLICATIONS

International Search Report and Written Opinion of PCT Application No. PCT/JP2020/040534, issued on Jan. 19, 2021, 11 pages of ISRWO.

*Primary Examiner* — Michael Jung
(74) *Attorney, Agent, or Firm* — CHIP LAW GROUP

(57) ABSTRACT

Provided is a semiconductor device capable of improving the optical response speed. The semiconductor device includes a pixel array portion in which a plurality of pixels are arranged in a matrix, each of the plurality of pixels including: a pixel forming region partitioned by a separation region in a semiconductor layer; a first semiconductor region of a first conductivity type and a second semiconductor region of a second conductivity type sequentially arranged from a first surface side of the pixel forming region toward a second surface side opposite to the first surface; a pn junction portion in which the first semiconductor region and the second semiconductor region are bonded; a charge extraction region of the second conductivity type provided in a side wall of the separation region; and a relay region of the second conductivity type provided at a position deeper (Continued)

than the second semiconductor region so as to be connected to the charge extraction region and the second semiconductor region. A plurality of the pn junction portions are scattered apart from each other, and the relay region has a higher impurity concentration than the second semiconductor region and terminates at a peripheral portion so as to surround a central portion of a surface of the second semiconductor region opposite to the pn junction portion side.

12 Claims, 41 Drawing Sheets

(51) Int. Cl.
*H10F 30/225* (2025.01)
*H10F 39/00* (2025.01)

(56) References Cited

U.S. PATENT DOCUMENTS

| 2017/0092801 | A1 | 3/2017 | Moussy et al. |
| 2019/0181177 | A1* | 6/2019 | Kobayashi ......... H01L 27/1464 |

FOREIGN PATENT DOCUMENTS

| JP | 2018-064086 A | 4/2018 |
| JP | 2018-201005 A | 12/2018 |
| JP | 2019-047486 A | 3/2019 |
| WO | 2018/174090 A1 | 9/2018 |

* cited by examiner

SEMICONDUCTOR DEVICE AND ELECTRONIC APPARATUS INCLUDING PN JUNCTION PORTIONS

CROSS REFERENCE TO RELATED APPLICATIONS

This application is a U.S. National Phase of International Patent Application No. PCT/JP2020/040534 filed on Oct. 28, 2020, which claims priority benefit of Japanese Patent Application No. JP 2019-226244 filed in the Japan Patent Office on Dec. 16, 2019. Each of the above-referenced applications is hereby incorporated herein by reference in its entirety.

TECHNICAL FIELD

The present technology (technology according to the present disclosure) relates to a semiconductor device and an electronic apparatus, and particularly, to a technology effective in application to a semiconductor device having an avalanche photodiode (APD) element and an electronic apparatus having the same.

BACKGROUND ART

As a semiconductor device, a distance image sensor (solid-state image sensor) that measures a distance by a ToF (Time of Flight) method has been attracting attention in recent years. This distance image sensor includes a pixel array portion in which a plurality of pixels are arranged in a matrix. The efficiency of the entire device is determined by the pixel dimensions and the pixel structure.

PTL 1 discloses a pixel having an APD element as a photoelectric conversion element. In this pixel, an APD element is configured in the pixel forming region of a semiconductor layer. The APD element has a photoelectric conversion portion that absorbs light incident on the pixel forming region of the semiconductor layer to generate carriers, and a multiplication portion that avalanche-multiplies the carriers generated by the photoelectric conversion portion.

CITATION LIST

Patent Literature

[PTL 1]
JP 2019-140132 A

SUMMARY

Technical Problem

By the way, in a distance image sensor, it is desired to reduce the RC (resistance, capacitance) component of a pixel and increase the optical response speed.

The present technology is to provide a semiconductor device capable of improving the optical response speed and an electronic apparatus having the same.

Solution to Problem

A semiconductor device according to an aspect of the present technology includes: a pixel array portion in which a plurality of pixels are arranged in a matrix, each of the plurality of pixels including: a pixel forming region partitioned by a separation region in a semiconductor layer; a first semiconductor region of a first conductivity type and a second semiconductor region of a second conductivity type sequentially arranged from a first surface side of the pixel forming region toward a second surface side opposite to the first surface; a pn junction portion in which the first semiconductor region and the second semiconductor region are bonded; a charge extraction region of the second conductivity type provided in a side wall of the separation region; and a relay region of the second conductivity type provided at a position deeper than the second semiconductor region so as to be connected to the charge extraction region and the second semiconductor region, wherein a plurality of the pn junction portions are scattered apart from each other, and the relay region has a higher impurity concentration than the second semiconductor region and terminates at a peripheral portion so as to surround a central portion of a surface of the second semiconductor region opposite to the pn junction portion side.

DESCRIPTION OF EMBODIMENTS

Hereinafter, an embodiment of the present technique will be described with reference to drawings. In the descriptions of the drawings to be referred to hereinafter, same or similar portions are denoted by same or similar reference signs. However, it should be noted that the drawings are schematic, and the relationships between thicknesses and planar dimensions, ratios of thicknesses of respective layers, and the like are different from actual ones. Therefore, specific thicknesses and dimensions should be determined by considering the following descriptions. In addition, it is of course that the drawings include portions where mutual dimensional relationships and ratios differ between the drawings. The advantageous effects described in the present specification are merely exemplary and are not restrictive, and other advantageous effects may be produced.

In the following embodiment, in the three directions orthogonal to each other in a space, a first direction and a second direction orthogonal to each other in the same plane are set to an X direction and a Y direction, respectively, and a third direction orthogonal to each of the first direction and the second direction is defined as a Z direction.

In the present specification and the accompanying drawings, electrons and holes are dominant carriers in the layer or region marked with "n" and "p", respectively.

First Embodiment

In the first embodiment, an example in which the present technology is applied to a back-illuminated distance image sensor as a semiconductor device will be described.

Figure 1:
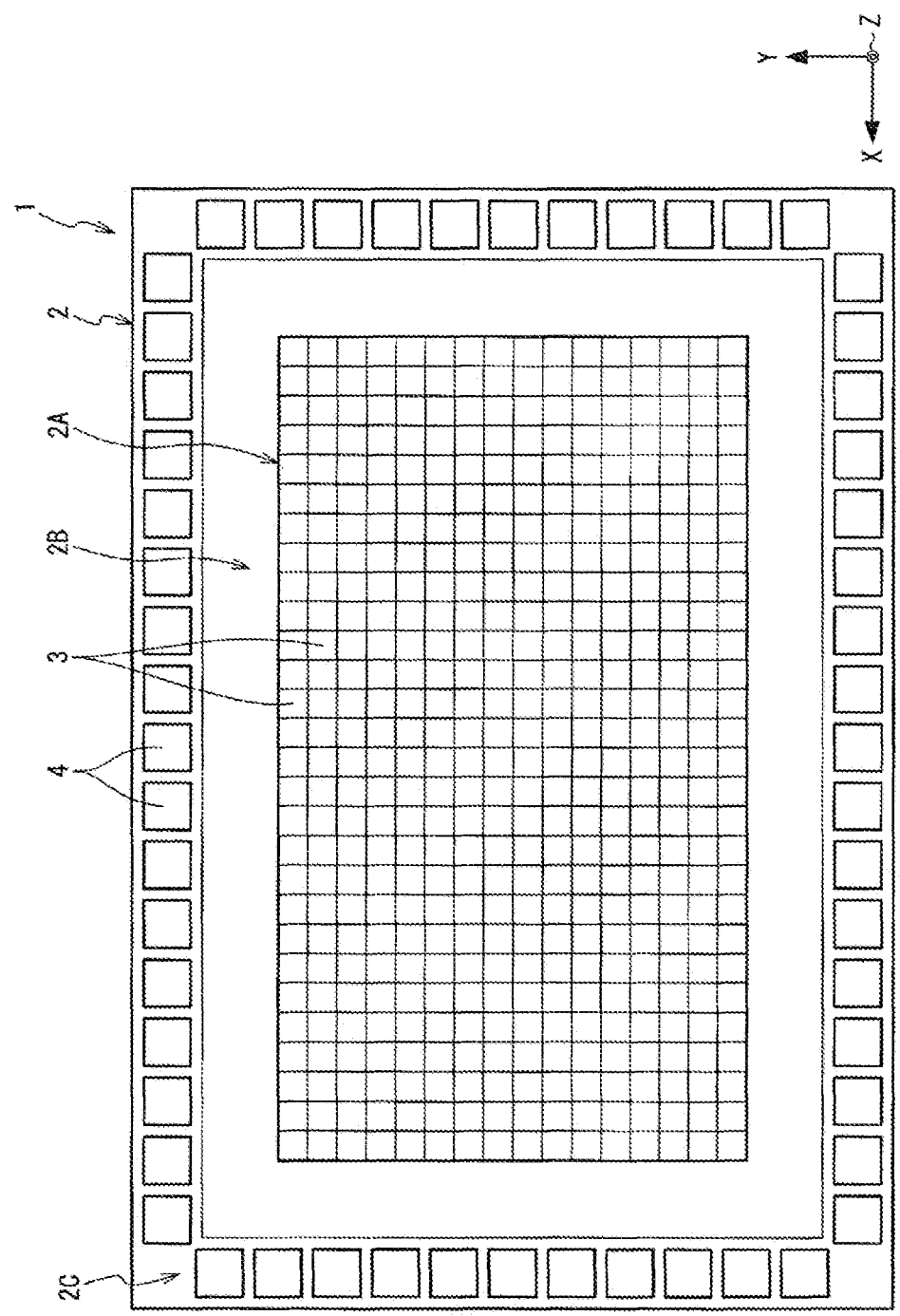
FIG. 1 is a chip layout diagram showing a configuration example of a distance image sensor according to a first embodiment of the present technology.

As shown in FIG. 1, a distance image sensor 1 according to the first embodiment of the present technology is mainly composed of a sensor chip 2 having a rectangular two-dimensional planar shape when viewed in a plan view. The sensor chip 2 has a rectangular pixel array portion 2A provided in the center, a peripheral portion 2B provided outside the pixel array portion 2A so as to surround the pixel array portion 2A, and a pad arrangement portion 2C provided outside the peripheral portion 2B so as to surround the peripheral portion 2B.

The pixel array portion 2A is a light receiving surface that receives light collected by an optical system (not shown). Then, in the pixel array portion 2A, a plurality of pixels 3 are arranged in a matrix in a two-dimensional plane including the X direction and the Y direction.

A bias voltage application portion (not shown) and other circuit portions are arranged in the peripheral portion 2B. The bias voltage application portion applies a bias voltage to each of the plurality of pixels 3 arranged in the pixel array portion 2A.

In the pad arrangement portion 2C, a plurality of electrode pads 4 are arranged along each of the four sides in the two-dimensional plane of the sensor chip 2. The electrode pad 4 is an external terminal used when the sensor chip 2 is electrically connected to an external device (not shown).

Figure 2A:
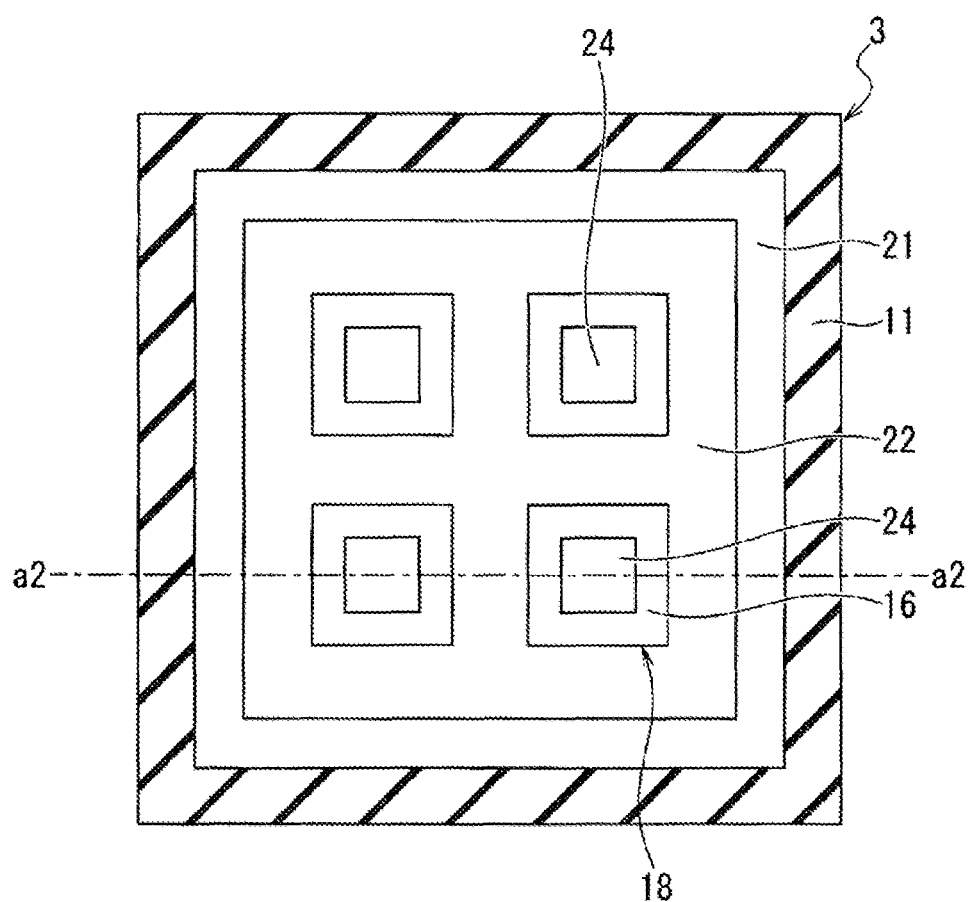
FIG. 2A is a schematic plan view showing a configuration example of a pixel according to a first embodiment of the present technology.
Figure 2B:
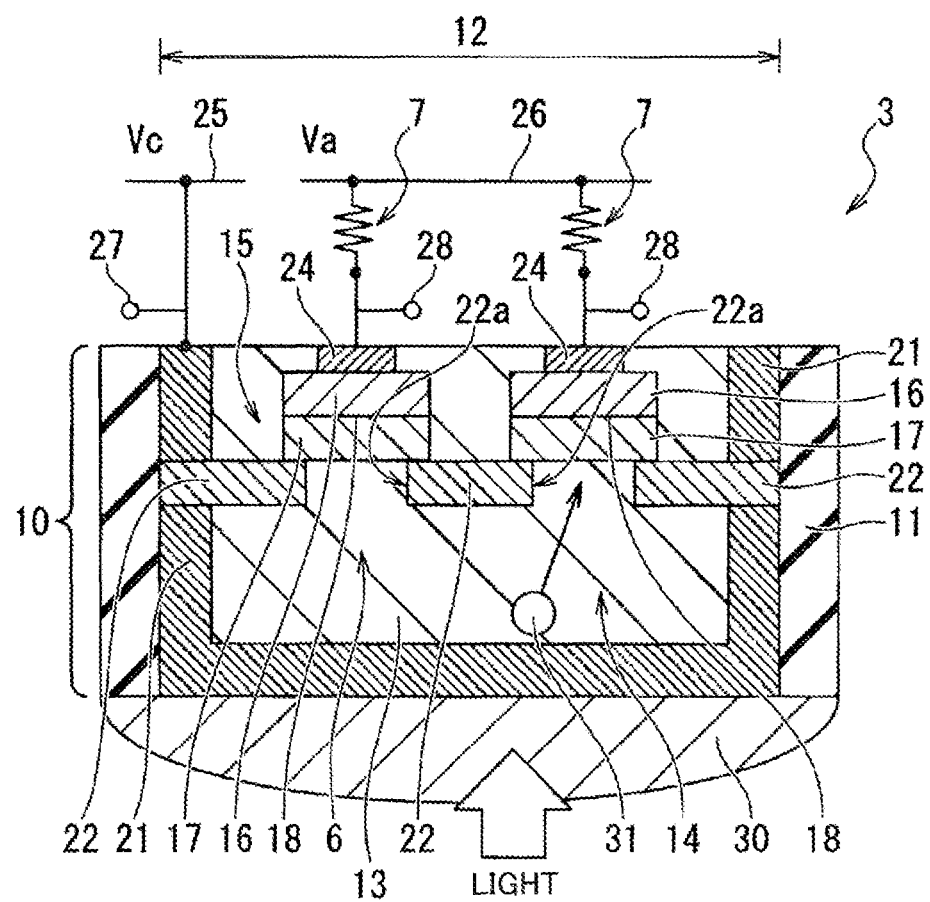
FIG. 2B is a schematic cross-sectional view showing a cross-sectional structure taken along line a2-a2 of FIG. 2A.

As shown in FIG. 2B, the sensor chip 2 is mainly composed of a sensor substrate 10 as a semiconductor layer. The sensor substrate 10 is composed of, for example, an n-type (second conductivity type) epitaxial substrate made of a single crystal silicon.

A wiring layer (not shown) is provided on the first surface of the sensor substrate 10. The second surface of the sensor substrate 10 opposite to the first surface serves as a light receiving surface that receives light. An on-chip lens 30 is provided for each pixel 3 on the second surface of the sensor substrate 10.

As shown in FIGS. 2A and 2B, each pixel 3 of the plurality of pixels 3 has a pixel forming region 12 partitioned by a separation region 11 on the sensor substrate 10, an APD (Avalanche photodiode) element 6 formed in the pixel forming region 12, and a quenching resistance element 7 electrically connected to the APD element 6 are provided. The quenching resistance element 7 is composed of, for example, a p-type MOSFET (Metal Oxide Semiconductor Field Effect Transistor).

The separation region 11 extends from the first surface of the sensor substrate 10 toward the second surface on the opposite side, and electrically and optically separates the adjacent pixel forming regions 12 from each other. The separation region 11 has, for example, a single-layer structure made of a silicon oxide film, or a three-layer structure in which both sides of the metal film are sandwiched between insulating films.

Although not shown in detail, the separation region 11 corresponding to one pixel has a square annular planar pattern when viewed in a plan view toward the first surface of the sensor substrate 10. The separation region 11 corresponding to the pixel array portion 2A has a composite planar pattern having a grid-like planar pattern in a square annular planar pattern.

The APD element 6 has an n-type semiconductor region 13 made of an n-type epitaxial substrate and a light absorbing portion 14 and a multiplication portion 15 sequentially provided in the n-type semiconductor region 13 from the second surface side of the sensor substrate 10 toward the first surface side.

The light absorbing portion 14 is a photoelectric conversion portion that is mainly composed of the n-type semiconductor region 13 and absorbs light incident from a second surface (light incident surface) of the sensor substrate 10 to generate holes (carriers). Then, the light absorbing portion 14 transfers the holes generated by the photoelectric conversion to the multiplication portion 15 by an electric field. The n-type semiconductor region 13 has the lowest impurity concentration among the semiconductor regions constituting the APD element.

The multiplication portion 15 avalanche-multiplies the holes transferred from the light absorbing portion 14. The multiplication portion 15 has a p-type (first conductivity type) first semiconductor region 16 and an n-type (second conductivity type) second semiconductor region 17 sequentially arranged from the first surface side of the sensor substrate 10 (the pixel forming region 12) toward the second surface side on the opposite side, and a pn junction portion 18 in which the first semiconductor region 16 and the second semiconductor region 17 are bonded. An avalanche multiplication region is formed at the pn junction portion 18.

The APD element 6 has an n-type charge extraction region 21 provided along the side wall of the separation region 11, and an n-type relay region 22 provided at a position deeper than the n-type second semiconductor region 17 so as to be connected to the n-type charge extraction region 21 and the n-type second semiconductor region 17. The APD element 6 has a p-type contact region 24 provided by being electrically connected to the p-type first semiconductor region 16.

A plurality of p-type first semiconductor regions 16 and n-type second semiconductor regions 17 are scattered to form pn junctions. Along with this, a plurality of pn junction portions 18 are also scattered. In this first embodiment, four p-type first semiconductor regions 16 and four n-type second semiconductor regions 17 are scattered, and four pn junction portions 18 are also scattered. The first semiconductor region 16, the second semiconductor region 17, and the pn junction portion 18 are arranged in a matrix. The p-type first semiconductor region 16 is composed of a p-type semiconductor region having a higher impurity concentration than the n-type semiconductor region 13, and the n-type second semiconductor region 17 is composed of an n-type semiconductor region having a higher impurity concentration than the n-type semiconductor region 13.

The p-type first semiconductor region 16 and the n-type second semiconductor region 17 has a square planar pattern when viewed in a plan view, for example. The p-type first semiconductor region 16 and the n-type second semiconductor region 17 may have different planar sizes, but they preferably have the same planar size from the viewpoint of ensuring the withstand voltage with the cathode and the adjacent region.

The n-type relay region 22 is composed of a semiconductor region having a higher impurity concentration than the n-type second semiconductor region 17, and terminates in the peripheral portion so as to surround the central portion of the back surface of the n-type second semiconductor region 17 opposite to the pn junction portion 18 side. That is, the n-type relay region 22 has an opening 22a directly below each of the four scattered second semiconductor regions 17. The central portion of the back surface of the n-type second semiconductor region 17 is electrically connected in contact with the n-type semiconductor region 13 through the opening 22a of the relay region 22, and the peripheral portion surrounding the central portion is electrically connected in contact with the n-type relay region 22. The relay region 22 has a composite planar pattern having a grid-like planar pattern in a square annular planar pattern.

The n-type charge extraction region 21 is provided along the side wall of the separation region 11. Then, in this first embodiment, the charge extraction region 21 is provided along the bottom surface of the lower portion on the second surface side of the sensor substrate 10. That is, the charge extraction region 21 is provided so that the semiconductor region 13 is surrounded by a first portion in contact with the side surface of the semiconductor region 13 and a second portion in contact with the bottom surface of the semiconductor region 13. The n-type charge extraction region 21 is composed of an n-type semiconductor region having a higher impurity concentration than the n-type relay region 22.

The upper portion of the n-type charge extraction region 21 is connected to the cathode wiring 25 to which the voltage Vc is applied. The cathode terminal 27 is connected to the connection path connecting the n-type charge extraction region 21 and the cathode wiring 25.

Four p-type contact regions 24 are provided corresponding to the four first semiconductor regions 16. The p-type contact region 24 is provided between the first surface of the sensor substrate 10 and the p-type first semiconductor region 16 in contact with the p-type first semiconductor region 16. In this first embodiment, the p-type contact region 24 is provided on the p-type first semiconductor region 16 with a bottom portion being in contact with the upper portion of the p-type first semiconductor region 16, but is not limited thereto. The p-type contact region 24 is composed of a p-type semiconductor region having a higher impurity concentration than the p-type first semiconductor region 16, and reduces the ohmic contact resistance with the contact electrode (not shown) and functions as a cathode.

Four quenching resistance elements 7 are provided corresponding to the four first semiconductor regions 16. One end side of the quenching resistance element 7 is electrically connected to the p-type first semiconductor region 16 via the p-type contact region 24. The other end side of the quenching resistance element 7 is electrically connected to the anode wiring 26 to which the voltage Va is applied. The anode terminal 28 is connected to the connection path connecting the n-type contact region 24 and the quenching resistance element 7.

A positive voltage as high as the breakdown voltage (Vdd) of the APD element 6 is applied to the cathode wiring 25 as the voltage Vc. Then, a negative voltage of 0 V or several V for turning on/off the multiplication of the APD element 6 is applied to the anode wiring 26 as the voltage Va.

A voltage is applied so that |Vc−Va|≥|Vbd| (breakdown voltage) when the APD element 6 is turned on, and |Vc−Va|<|Vbd| when it is turned off.

The light to be detected is incident from the lower portion of FIG. 2B (the second surface of the sensor substrate 10), collected by the on-chip lens 30, and then photoelectrically converted by the light absorbing portion 14 to generate electron-hole pairs. A voltage higher than the breakdown voltage Vbd is applied between the anode and cathode to generate a strong electric field in the multiplication portion 15, and the holes 31 generated in the light absorbing portion 14 due to the incident light propagate to the multiplication portion 15 and are amplified in the Geiger mode. When the multiplication current flows through the quenching resistance element 7, the anode voltage drops. When the anode-cathode voltage drops below the breakdown voltage, the multiplication stops (quenching operation). Then, the anode-cathode voltage is reset to a voltage higher than the breakdown voltage so that the next new photon can be detected. The Geiger-mode APD element 6 is also called a single-photon avalanche diode (SPAD).

In the conventional pixel structure, the electrons enter the n-type charge extraction region through the substrate and are discharged to the cathode wiring of the voltage Vc. However, since the electron movement path is long and the impurity concentration is low, the resistance value becomes high.

Figure 3:
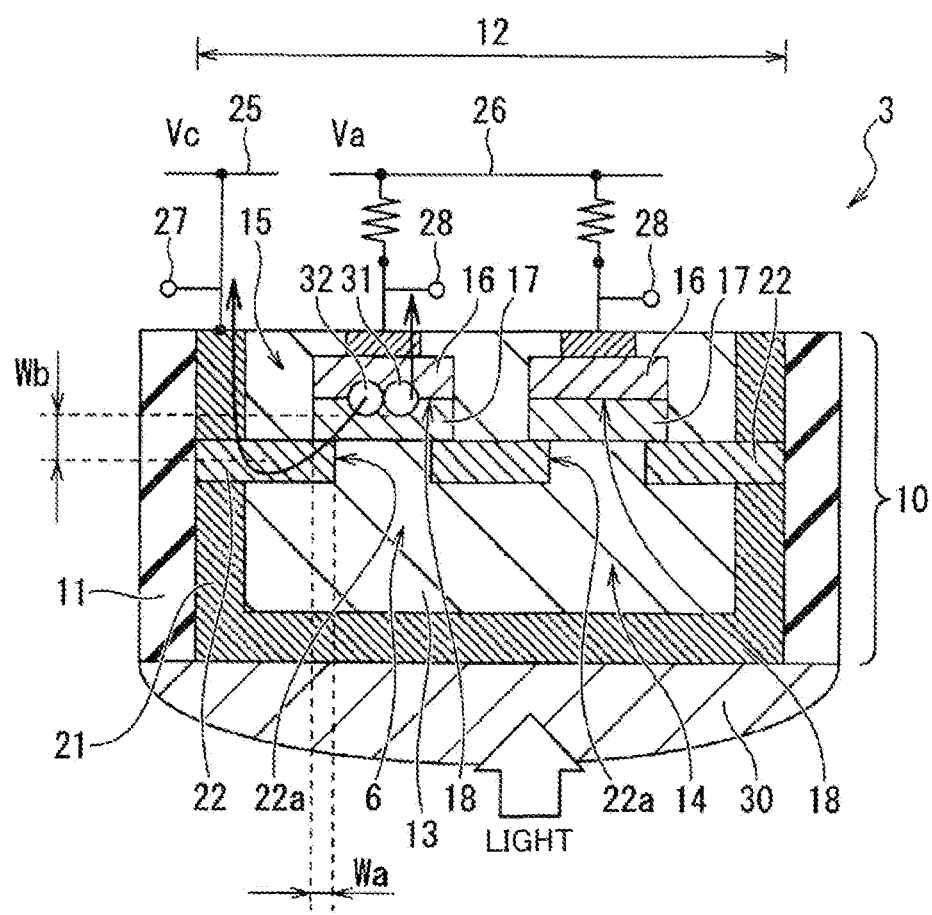
FIG. 3 is a schematic cross-sectional view showing a charge movement path.

On the other hand, in the pixel 3 according to the first embodiment of the present technology, as shown in FIG. 3, the electron 32 generated in the multiplication portion 15 travels through the n-type second semiconductor region 17 to enter the n-type relay region 22 and propagates through the n-type relay region 22 to enter the n-type charge extraction region 21 and is discharged to the cathode wiring 25 of the voltage Vc. The n-type relay region 22 has a higher impurity concentration than the n-type second semiconductor region 17, and the charge movement path is shorter than that of the conventional structure, so that the resistance component can be suppressed to a low level.

Even if the pn junction portions 18 in which the avalanche multiplication region is formed are scattered and the n-type relay region 22 is arranged at a position deeper than the n-type second semiconductor region 17 of the pn junction portion 18, a potential barrier is generated in the region of the n-type relay region 22, and the holes generated in the light absorbing portion 14 can be guided to the multiplication portion 15 by this potential barrier, which may not lead to a decrease in light detection efficiency.

In order to enhance the effect of this first embodiment, it is necessary to increase the impurity concentration of the n-type relay region 22 as much as possible, or to increase the width of the electron movement path to reduce the resistance value. In particular, since the charge movement path from the n-type second semiconductor region 17 to the n-type relay region 22 is narrow, it is necessary to reduce the resistance value in this movement path. In order to suppress the resistance value from the multiplication portion 15 to the cathode to about several kΩ, as shown in FIG. 3, it is preferable that an overlap region (superimposition region) Wa of the n-type second semiconductor region 17 and the n-type relay region 22 is 0.2 μm or more, and the impurity concentration is 5e16 cm$^{-3}$ or more.

In this overlap region Wa, the tail portion of the impurity profile of the n-type relay region 22 may hang on the pn junction portion 18 to change the impurity profile of the pn junction portion 18. Thus, it is preferable to suppress the peak fluctuation of the impurity profile of the n-type relay region 22 within a few percent. For example, if the depth of the n-type second semiconductor region 17 is about 1 μm, Wb may be about 1 μm.

As described above, the n-type relay region 22 needs to have a high impurity concentration in order to reduce the resistance value and to suppress the influence of the pn junction portion 18 on the impurity profile to be small, so that it is preferable that the impurity profile is as steep as possible in the depth direction.

Thus, it is preferable that the n-type relay region 22 is composed of a semiconductor region in which arsenic (As), which has less channeling and has a steeper impurity profile than phosphorus (Phos) as an impurity, is diffused.

The n-type second semiconductor region 17 may be either phosphorus (Phos) or arsenic (As), but considering the connectivity with the n-type relay region 22 in the overlap region Wa, phosphorus (Phos) having a broad impurity profile is easier to design.

Since the n-type relay region 22 forms a potential barrier during the SPAD operation, the n-type relay region 22 also has a role of inducing the holes 31 photoelectrically converted by the light absorbing portion 14 to enter the pn junction portion 18.

In the pixel 3 of the first embodiment, the area of each region is reduced by scattering the pn junction portions 18, the capacitance of the multiplication portion 15 is reduced, and the rising characteristic of the output pulse is improved. The electrons generated at each pn junction portion 18 enter the n-type relay region 22 having a high impurity concentration and a low resistance value from the n-type second semiconductor region 17 and propagate to the n-type charge extraction region 21. Thus, the resistance component can be reduced as compared with the conventional technique. Thus, according to the distance image sensor 1 of the first embodiment, the RC (resistance, capacitance) component of the pixel 3 can be reduced and the optical response speed can be increased.

Modification Example

Figure 4A:
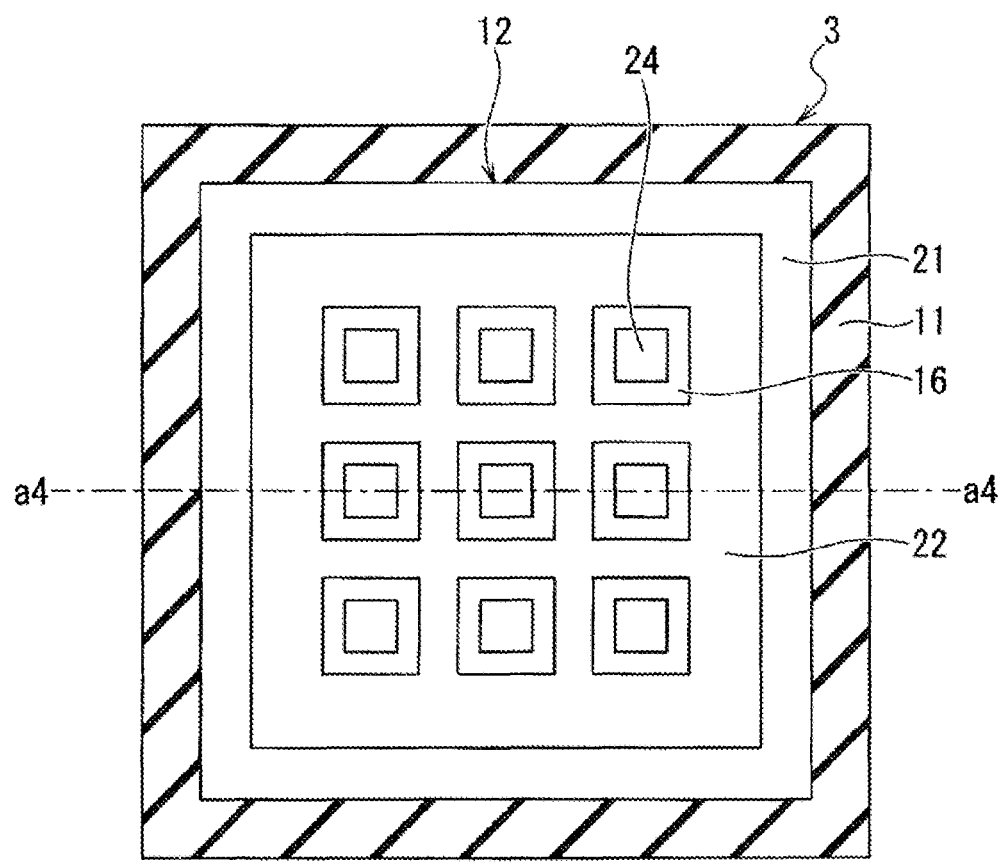
FIG. 4A is a schematic plan view showing a modification example of the first embodiment of the present technology.
Figure 4B:
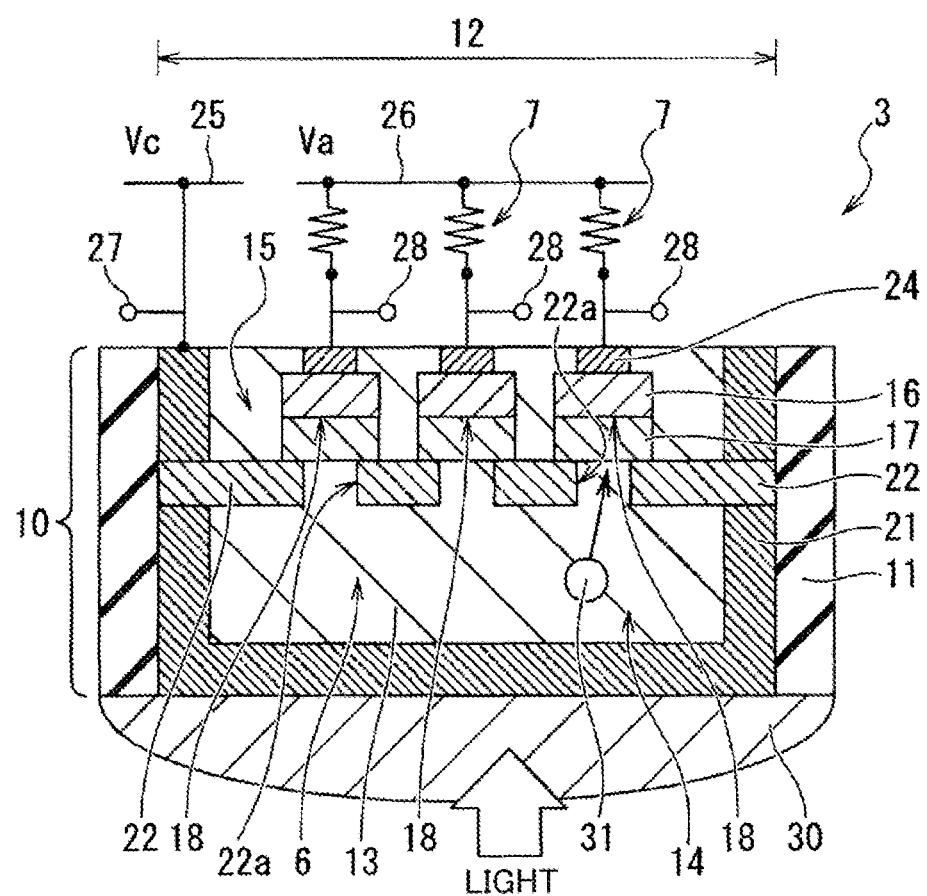
FIG. 4B is a schematic cross-sectional view showing a cross-sectional structure taken along line a4-a4 of FIG. 4A.

FIGS. 4A and 4B are diagrams showing a modification example of the above-mentioned first embodiment, in which nine p-type first semiconductor regions 16 and nine n-type second semiconductor regions 17 are scattered in three vertical rows by three horizontal rows, and nine pn junction portions 18 in which an avalanche multiplication region is formed are also scattered.

The n-type relay region 22 terminates at the peripheral portion so as to surround the central portion of the back surface of each of the nine second semiconductor regions 17. The relay region 22 has a composite planar pattern having a grid-like planar pattern in a square annular planar pattern.

Similarly to the first embodiment described above, the anode terminal 28 is connected to each p-type first semiconductor region 16 and is connected to the anode wiring 26 of the voltage Va via the quenching resistance element 7.

A voltage is applied so that |Vc−Va|≥|Vbd| (breakdown voltage) when the APD element 6 detects light (ON state), and |Vc−Va|<|Vbd| when light is not detected (OFF state).

In the examples of FIGS. 4A and 4B, the holes 31 photoelectrically converted by the light absorbing portion 14 enter the plurality of scattered pn junction portions 18 and are amplified in the Geiger mode and output from the anode terminal 28 as shown in FIG. 4B.

By scattering the pn junction portions 18 in this way, the area of each region is reduced, the capacitance of the multiplication portion 15 is reduced, and the rising characteristic of the output pulse is improved. The electrons generated at each pn junction portion 18 enter the n-type relay region 22 having a high impurity concentration and a low resistance value from the n-type second semiconductor region 17 and propagate to the n-type charge extraction region 21. Thus, the resistance component can be reduced as compared with the conventional technique.

Second Embodiment

A distance image sensor according to the second embodiment has basically the same configuration as the distance image sensor 1 according to the first embodiment described above, and the configuration of the pixel is different from that of the first embodiment described above.

Figure 5A:
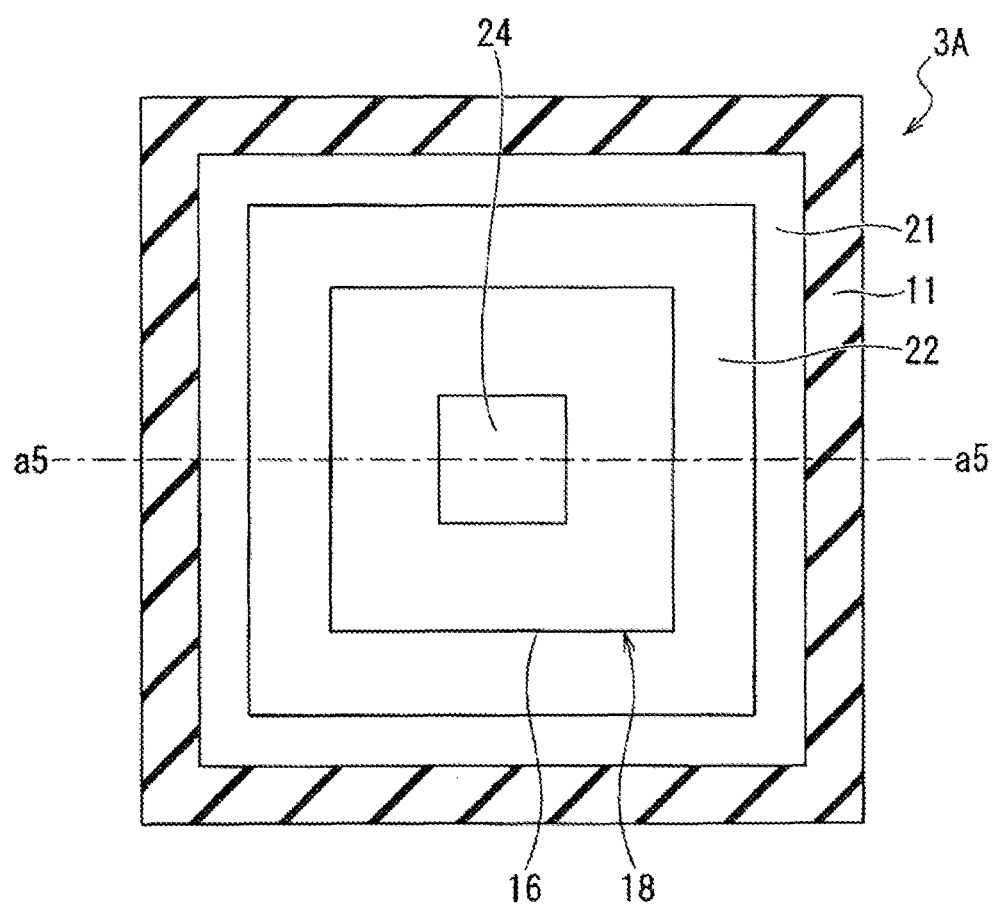
FIG. 5A is a schematic plan view showing a configuration example of a pixel according to a second embodiment of the present technology.
Figure 5B:
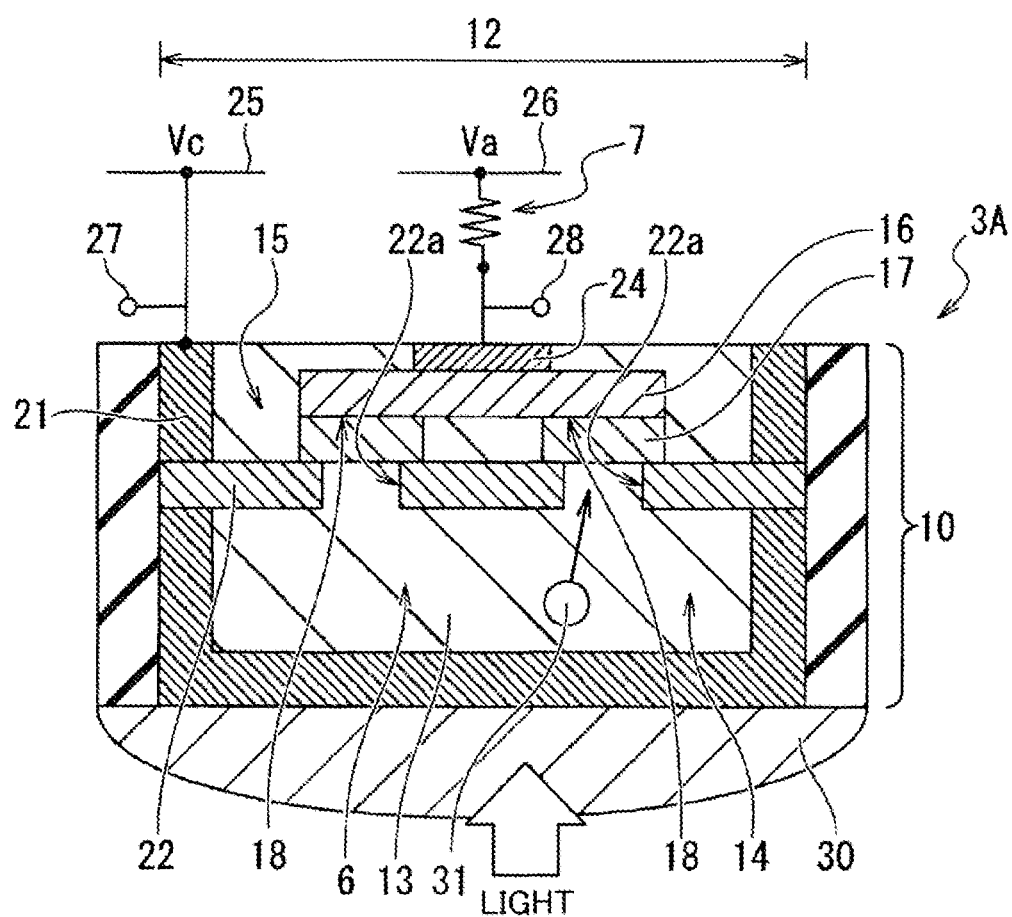
FIG. 5B is a schematic cross-sectional view showing a cross-sectional structure taken along line a5-a5 of FIG. 5A.

That is, as shown in FIGS. 2A and 2B, the pixel 3 of the above-mentioned first embodiment has a configuration in which the same number of p-type first semiconductor regions 16 and n-type second semiconductor regions 17 are scattered to provide a plurality of pn junction portions 18. On the other hand, as shown in FIGS. 5A and 5B, the pixel 3A of the second embodiment has a configuration in which one p-type first semiconductor region 16 and a plurality of second semiconductor regions 17 form pn junctions so that a plurality of pn junction portions 18 are scattered. The pixel 3A of the second embodiment has a configuration in which one quenching resistance element 7 is connected to one p-type first semiconductor region 16. In this second embodiment, four second semiconductor regions 17 and one first semiconductor region 16 form pn junctions which are scattered apart from each other, whereby four pn junction portions 18 are also scattered apart from each other.

As shown in FIG. 5B, the hole 31 generated in the light absorbing portion 14 enter any one of the four pn junction portions 18, is amplified, and is output from the anode terminal 28. In the pixel 3A of the second embodiment, the p-type first semiconductor region 16 is common, and the pn junction portions 18 are connected in parallel. Thus, the capacitance is the sum of the capacitances of the pn junction portions 18, so that it does not decrease. However, since the charge discharged from each pn junction portion 18 passes through the n-type relay region 22 having a low resistance value, the rising characteristic can be improved by the effect of reducing the resistance component. Since the output is one system, it is effective when the conventional circuit configuration is used.

Since the p-type first semiconductor region 16 and the quenching resistance element 7 are both in common, when any one of the four pn junction portions 18 is amplified, the voltage applied to the anode in the quenching operation is lowered to cause quenching. Then, during this operation, even if holes enter the other three pn junction portions 18, they are not amplified.

Third Embodiment

A distance image sensor according to the third embodiment has basically the same configuration as the distance image sensor 1 according to the first embodiment described above, and the configuration of the pixel is different from that of the first embodiment described above.

Figure 6A:
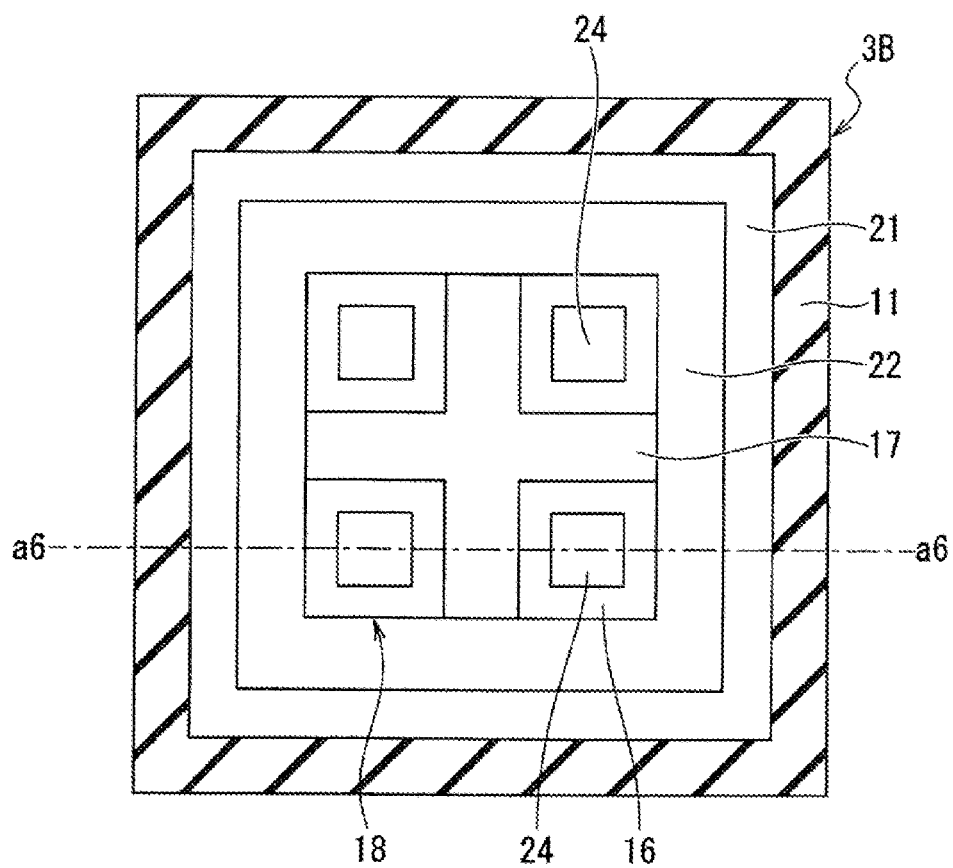
FIG. 6A is a schematic plan view showing a configuration example of a pixel according to a third embodiment of the present technology.
Figure 6B:
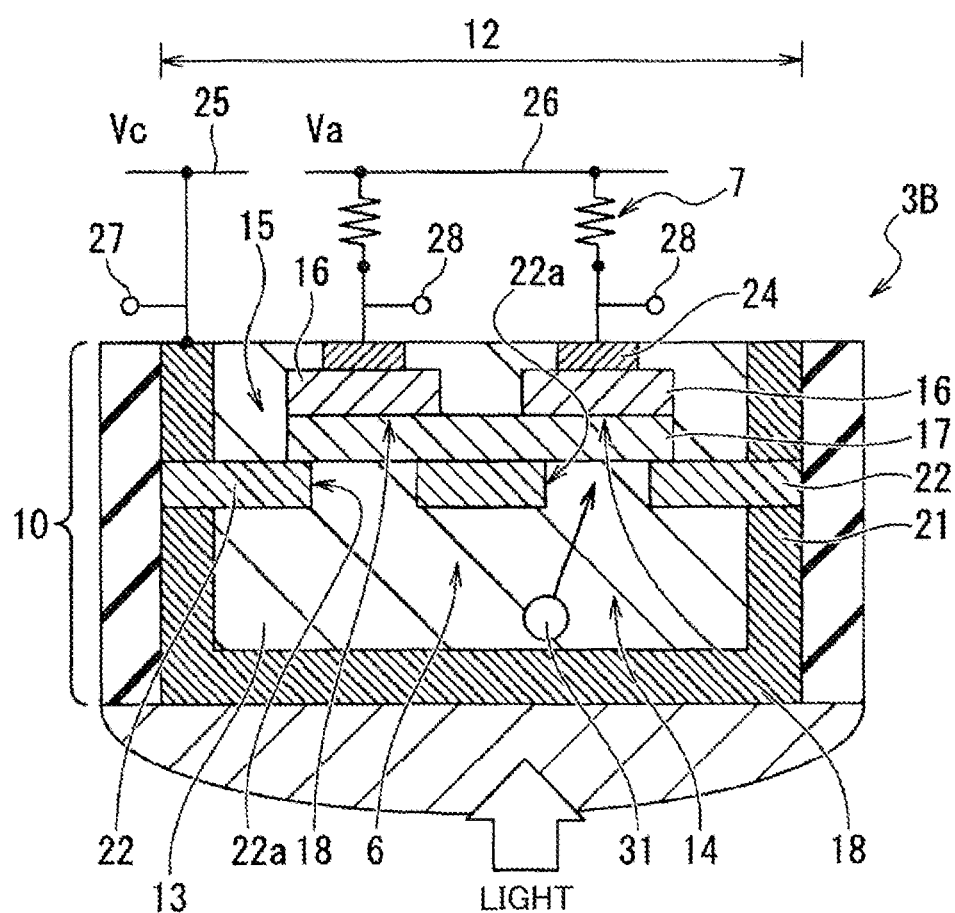
FIG. 6B is a schematic cross-sectional view showing a cross-sectional structure taken along line a6-a6 of FIG. 6A.

That is, as shown in FIGS. 2A and 2B, the pixel 3 of the above-mentioned first embodiment has a configuration in which the same number of p-type first semiconductor regions 16 and n-type second semiconductor regions 17 are scattered to form a plurality of pn junction portions 18. On the other hand, as shown in FIGS. 6A and 6B, the pixel 3B of the third embodiment has a configuration in which a plurality of p-type first semiconductor regions 16 and one n-type second semiconductor region 17 form pn junctions so that a plurality of pn junction portions 18 are scattered. The pixel 3B of the third embodiment has a configuration in which the quenching resistance element 7 is connected to each of the p-type first semiconductor regions 16 as in the first embodiment described above. In this third embodiment, four p-type first semiconductor regions 16 and one n-type second semiconductor region 17 are scattered apart from each other to form pn junctions, whereby four pn junction portions 18 are also scattered apart from each other.

In the pixel 3B of the third embodiment, the output signals are separately output from the four anode terminals 28 individually connected to the four p-type first semiconductor regions 16. The separation characteristic between the pixels 3B separated in the separation region 11 is better for the pixel 3 of the first embodiment described above. However, in the pixel 3B of the third embodiment, since the n-type second semiconductor region 17 is provided in the central portion of the n-type relay region 22, a wide charge movement path can be taken from the n-type second semiconductor region 17 to the n-type relay region 22, so that the resistance value can be reduced accordingly.

Fourth Embodiment

A distance image sensor according to the fourth embodiment has basically the same configuration as the distance image sensor 1 according to the first embodiment described above, and the configuration of the pixel is different from that of the first embodiment described above.

Figure 7A:
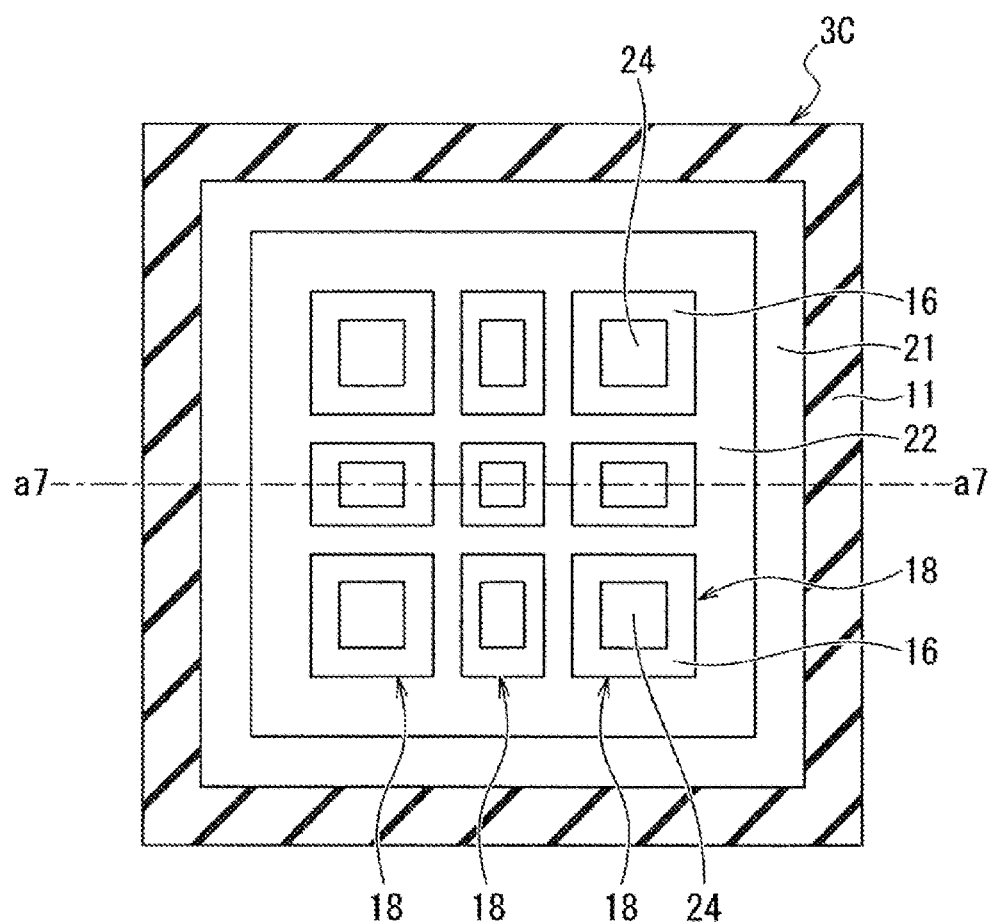
FIG. 7A is a schematic plan view showing a configuration example of a pixel according to a fourth embodiment of the present technology.
Figure 7B:
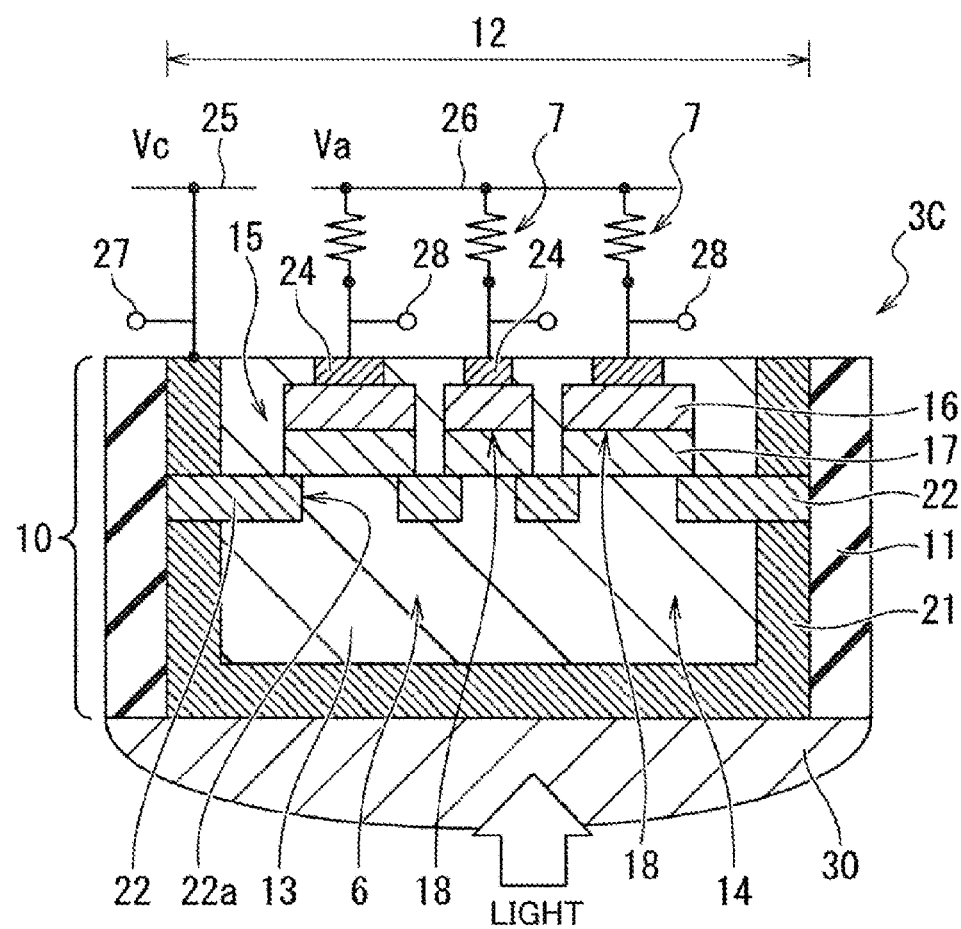
FIG. 7B is a schematic cross-sectional view showing a cross-sectional structure taken along line a7-a7 of FIG. 7A.

That is, in the pixels 3 of the above-mentioned first embodiment, the areas of the plurality of scattered pn junction portions 18 are substantially the same. On the other hand, in the pixel 3C of the fourth embodiment, as shown in FIGS. 7A and 7B, the area of the pn junction portion 18 located in the central portion of the pixel 3C is smaller than the area of the pn junction portion 18 located in the peripheral portion of the pixel 3C.

The light incident on one pixel 3C is collected in the central region of the pixel 3C by the on-chip lens 30. Thus, the light amount distribution is large in the central portion of the pixel 3C and becomes smaller toward the peripheral portion. Thus, when a plurality of pn junction portions 18 are scattered, the light detection probability is high in the pn junction portion 18 located in the central portion of the pixel 3C, and the light detection probability is low in the pn junction portion 18 located in the peripheral portion of the pixel 3C. Since there is a dead time until the voltage is restored by the recharge operation after detecting one photon, if the amount of incident light increases and one pn junction portion 18 continuously detects light at a high frequency, there is a possibility that the photons incoming during the dead time may not be detected. Thus, it is possible to reduce the influence of the dead time by increasing the number of scattered pn junction portions 18 as much as possible and detecting light. Thus, as shown in FIG. 7B, the detection error due to the dead time can be reduced by decreasing the area of the pn junction portion 18 in the central portion having a large amount of light in the pixel 3C, and increasing the area of the pn junction portion 18 in the peripheral portion having a small amount of light so that light is detected by the scattered pn junction portions 18 with approximately equal probability.

Fifth Embodiment

A distance image sensor according to the fifth embodiment has basically the same configuration as the distance image sensor 1 according to the first embodiment described above, and the configuration of the pixel is different from that of the first embodiment described above.

Figure 8A:
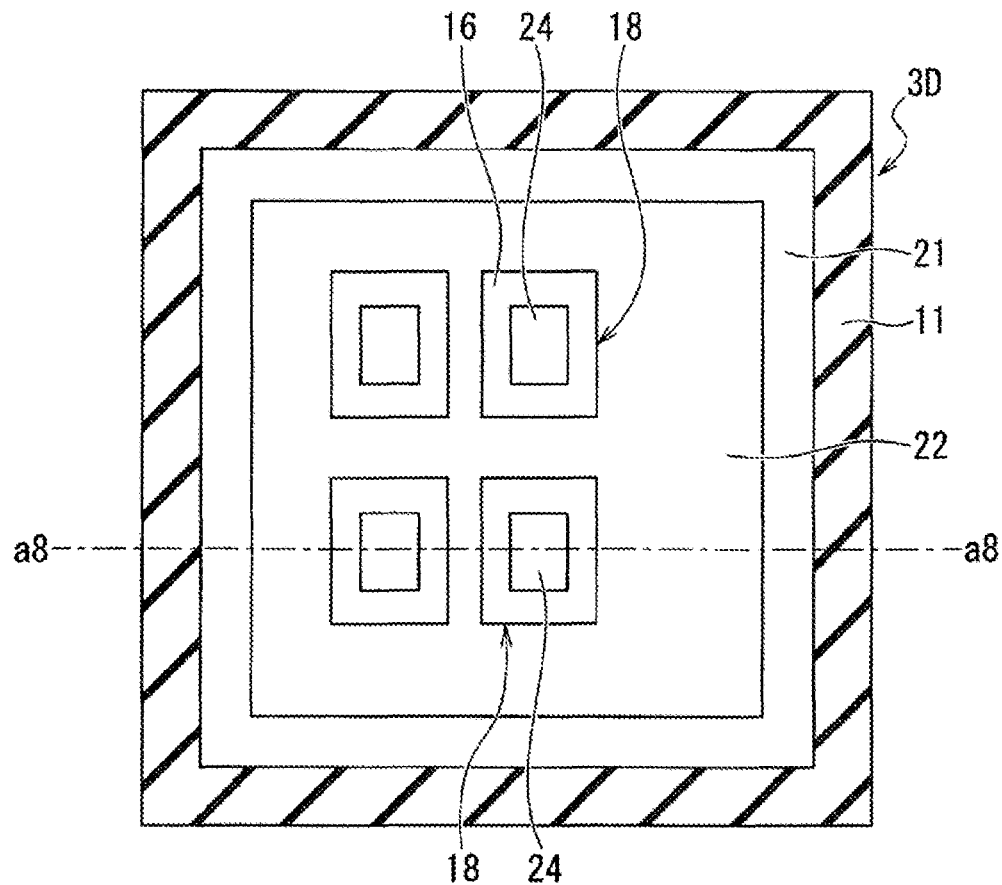
FIG. 8A is a schematic plan view showing a configuration example of a pixel according to a fifth embodiment of the present technology.
Figure 8B:
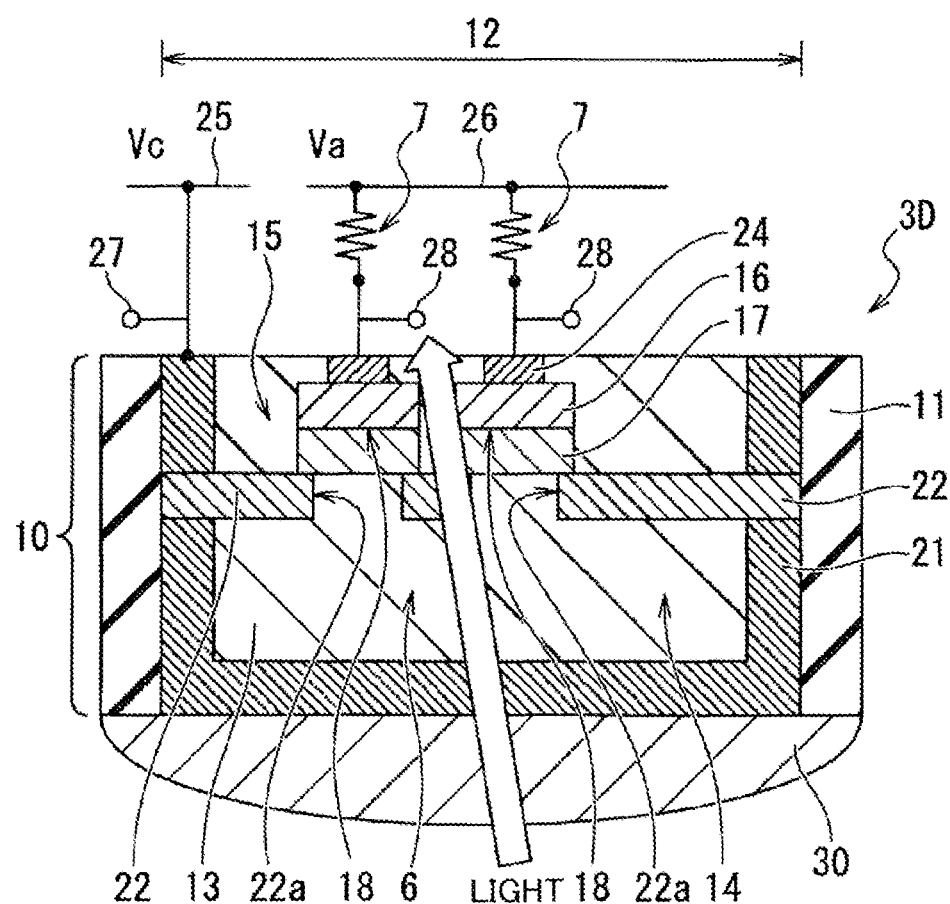
FIG. 8B is a schematic cross-sectional view showing a cross-sectional structure taken along line a8-a8 of FIG. 8A.

That is, as shown in FIGS. 8A and 8B, in the pixel 3D of the fifth embodiment, the width of each of the plurality of scattered pn junction portions 18 is narrow according to the light amount distribution when light enters the pixel 3D obliquely, and the plurality of scattered pn junction portions 18 are arranged so as to be close to each other in the optical axis direction.

In the peripheral portion of the pixel array portion 2A (see FIG. 1) in which a plurality of pixels 3D are arranged in an array, light may be obliquely incident on the pixels 3D due to the influence of the angle of view of the imaging lens. In this case, as shown in FIG. 8B, since the beam collapses inside one pixel 3D, the light amount distribution is biased in that direction. Although the on-chip lens 30 may be shifted with respect to the pixel 3D to mitigate this effect, if this is not possible, it is better to use the configuration of the pixel 3D of the third embodiment.

That is, as shown in FIGS. 8A and 8B, the scattered pn junction portions 18 are arranged close to each other in the optical axis direction while narrowing the width thereof according to the light amount distribution when the beam is obliquely incident.

In this way, the capacitance of the multiplication region (the multiplication portion 15) can be reduced by reducing the multiplication area (the area of the pn junction portion 18) without substantially changing the resistance component.

Sixth Embodiment

The sixth embodiment shows a method of changing the light detection probability of a pixel according to the amount of incident light. Specifically, as shown in FIGS. 9A and 9B, the wiring for applying a voltage to the p-type first semiconductor region 16 is divided and connected to the central portion and the peripheral portion of the pixel 3E so that the voltage Va can be applied separately to the respective portions.

Generally, when the amount of light entering a pixel is large, after one photon is detected, the next photon enters the amplification region and amplification occurs again before the anode voltage returns to the original voltage by the recharge operation. Thus, there is a possibility that an amplified (saturation) state may always be created and detection errors may occur.

In the pixel 3E of the sixth embodiment, the photon detection probability is changed according to the amount of light. That is, the light detection efficiency is increased when the amount of incident light entering the pixel 3E is small, and the light detection efficiency is lowered when the amount of light is large so that the above-mentioned saturation state is avoided.

Figure 9A:
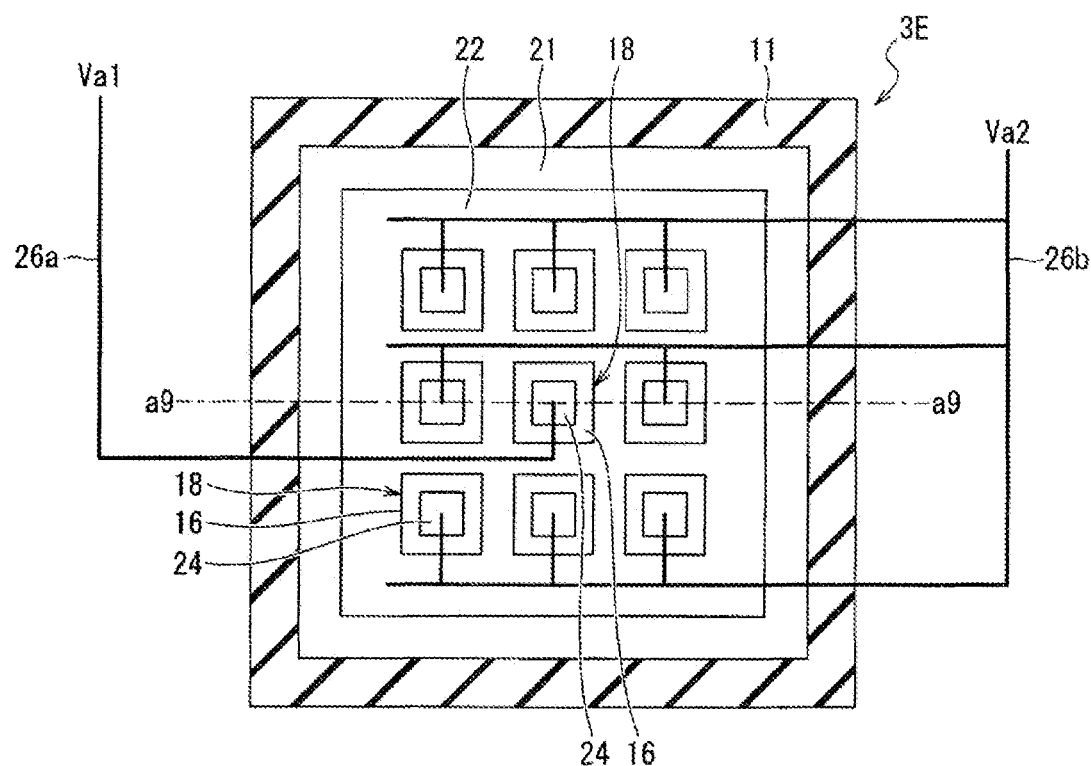
FIG. 9A is a schematic plan view showing a configuration example of a pixel according to a sixth embodiment of the present technology.
Figure 9B:
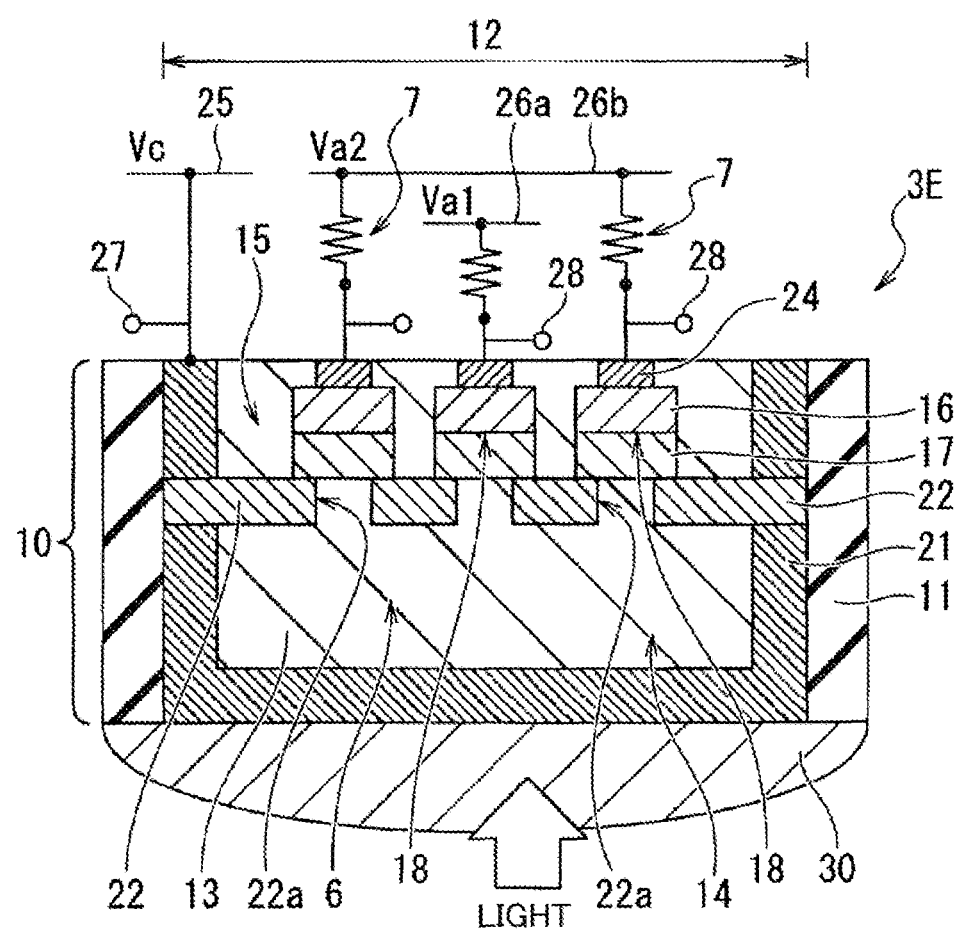
FIG. 9B is a schematic cross-sectional view showing a cross-sectional structure taken along line a9-a9 of FIG. 9A.

As shown in FIGS. 9A and 9B, the pn junction portion 18 located in the central portion of the pixel 3E is connected to the anode wiring 26a to which the voltage Va1 is supplied. The pn junction portion 18 located in the peripheral portion of the pixel is connected to the anode wiring 26b to which a voltage Va2 different from the voltage Va1 is supplied.

When the amount of light entering the pixel 3E is large, the voltage Va1 is increased to put the APD element 6 into an ON state ($|Vc-Va1|\geq|Vbd|$) capable of detecting light, and the voltage Va2 is decreased to put the APD element 6 into an OFF state ($|Vc-Va2|<|Vbd|$). Since only the holes entering the central portion of the pixel 3E are amplified and the holes entering the peripheral portion are not amplified, the light detection efficiency can be effectively lowered. By doing so, saturation can be avoided when the amount of light is large.

When the amount of light entering the pixel 3E is small, it is necessary to increase the sensitivity as much as possible. Thus, the voltage Va1 and the voltage Va2 are increased to put the APD elements 6 in all the scattered pn junction portions 18 into the ON state ($|Vc-Va1|\geq|Vbd|$ and $|Vc-Va2|\geq|Vbd|$). Since the photoelectrically converted holes are amplified even if they enter any of the pn junction portions 18 scattered in one pixel 3E, the light detection efficiency can be increased and the S/N ratio can be improved.

For example, in the case of configuring a SPAD pixel for a monitor that detects an optical pulse of a light source by ToF or the like, if the reflection from a ranging target object is small and the amount of light of the light source is increased, the amount of light incident on the SPAD pixel for the monitor also increases. Thus, saturation can be prevented by setting the voltage Va1 to the ON state and setting the voltage Va2 to the OFF state to reduce the light detection efficiency. When the reflection from the ranging target object is large and the amount of light of the light source is decreased, the S/N ratio can be increased by setting the voltage Va1 and the voltage Va2 to the ON state to increase the detection efficiency.

Seventh Embodiment

Figure 10A:
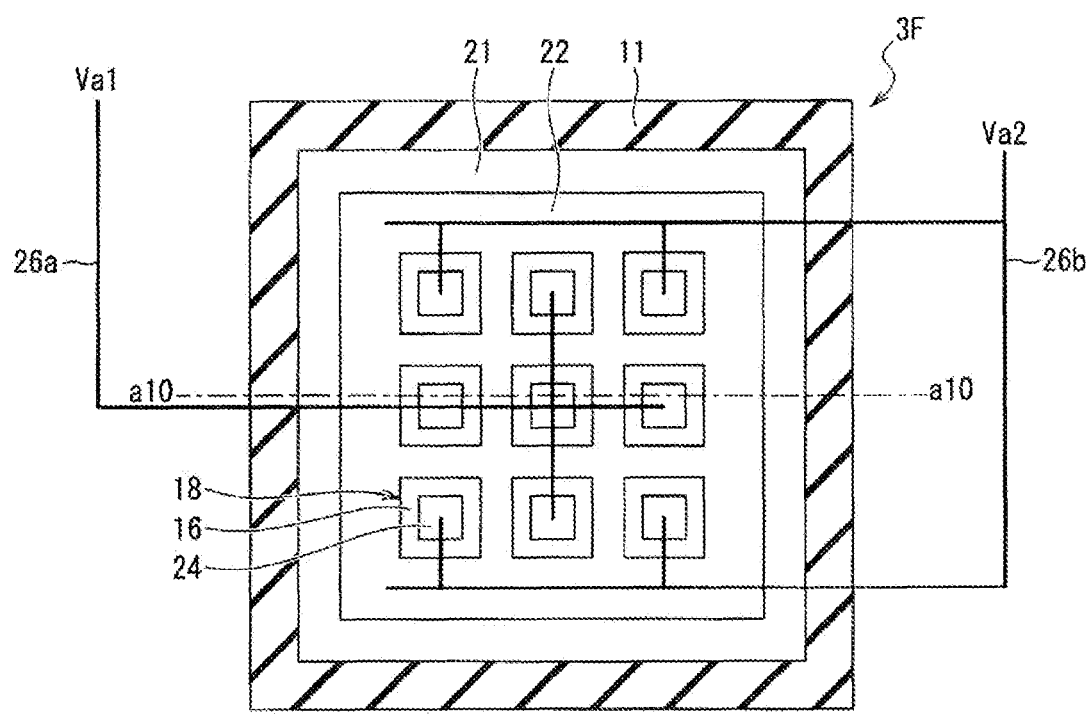
FIG. 10A is a schematic plan view showing a configuration example of a pixel according to a seventh embodiment of the present technology.
Figure 10B:
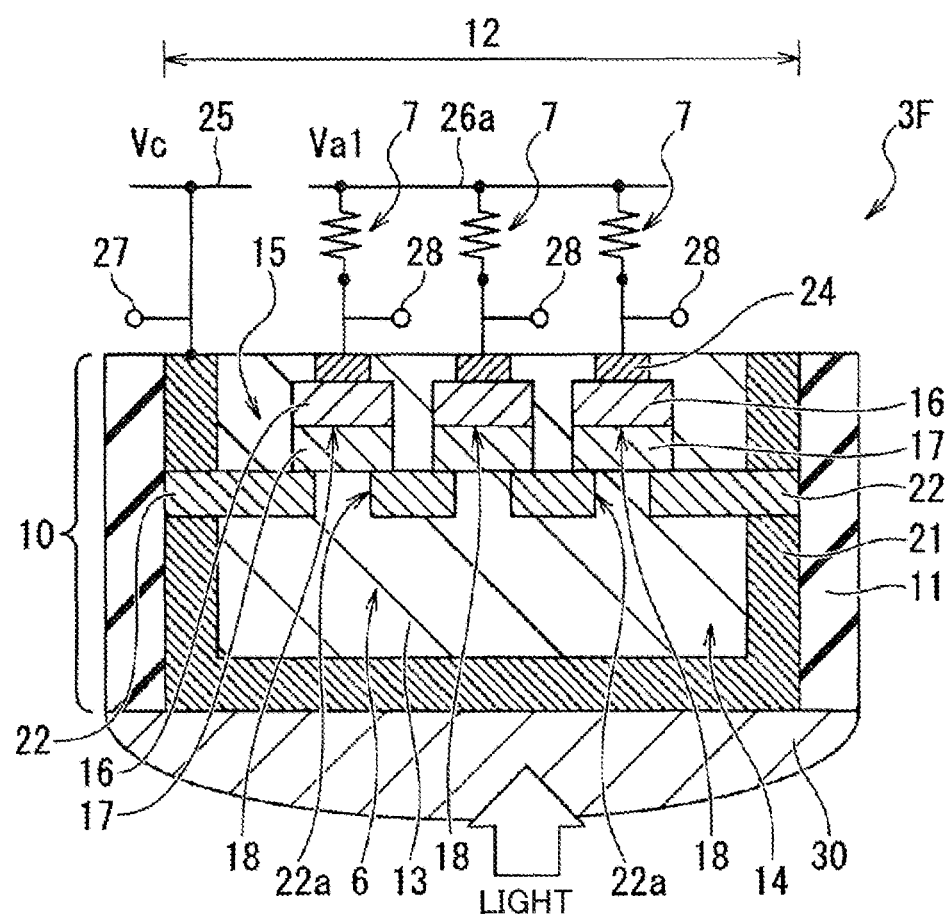
FIG. 10B is a schematic cross-sectional view showing a cross-sectional structure taken along line a10-a10 of FIG. 10A.

In the sixth embodiment described above, the light detection efficiency is switched between one pn junction portion 18 located in the central portion of one pixel and all nine pn junction portions 18 located in the peripheral portion. However, if the switching range of the detection efficiency is too large, the combination of the connected regions may be changed. For example, as shown in FIGS. 10A and 10B, a pn junction portion 18 located in the central portion of the pixel 3F and four pn junction portions 18 adjacent to the pn junction portion 18 located in the central portion of the pixel 3F in the matrix direction are connected to the wiring of the voltage Va1. The remaining four pn junction portions 18 are collectively connected to the wiring of the voltage Va2.

When the amount of light entering the pixel is large, the voltage Va1 is raised to put it into the ON state, and the voltage Va2 is lowered to put it into the OFF state. Since only the holes that have entered the four regions adjacent to the central portion are amplified and the holes that have entered the other regions are not amplified, the light detection efficiency can be effectively lowered and saturation can be prevented. When the amount of light entering the pixel is small, the voltages of Va1 and Va2 are increased to put all the divided regions into the ON state. Since the photoelectrically converted holes are amplified no matter which region they enter, the light detection efficiency can be increased and the S/N ratio can be improved.

By changing the combination of pixels to be wired according to the amount and distribution of light in this way, it is possible to freely set the switching range of the light detection efficiency, although it is within the range of the number of divisions (the number of scattered pn junction portions 18).

Eighth Embodiment

Figure 11A:
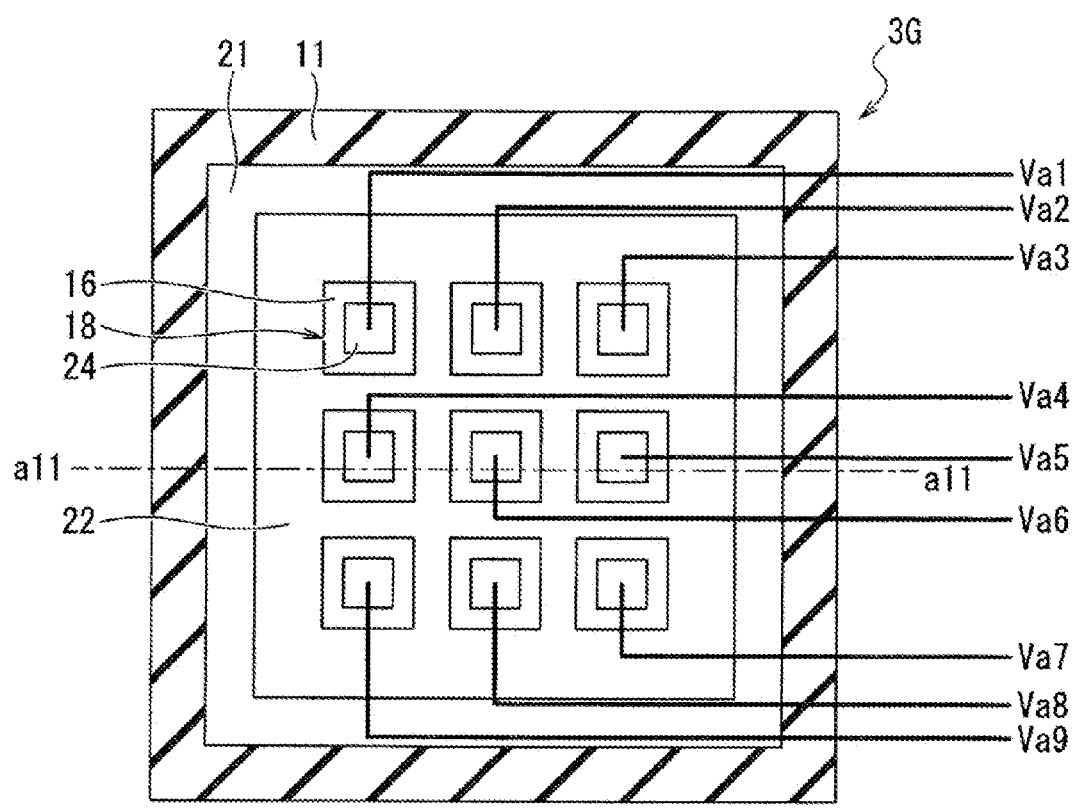
FIG. 11A is a schematic plan view showing a configuration example of a pixel according to an eighth embodiment of the present technology.
Figure 11B:
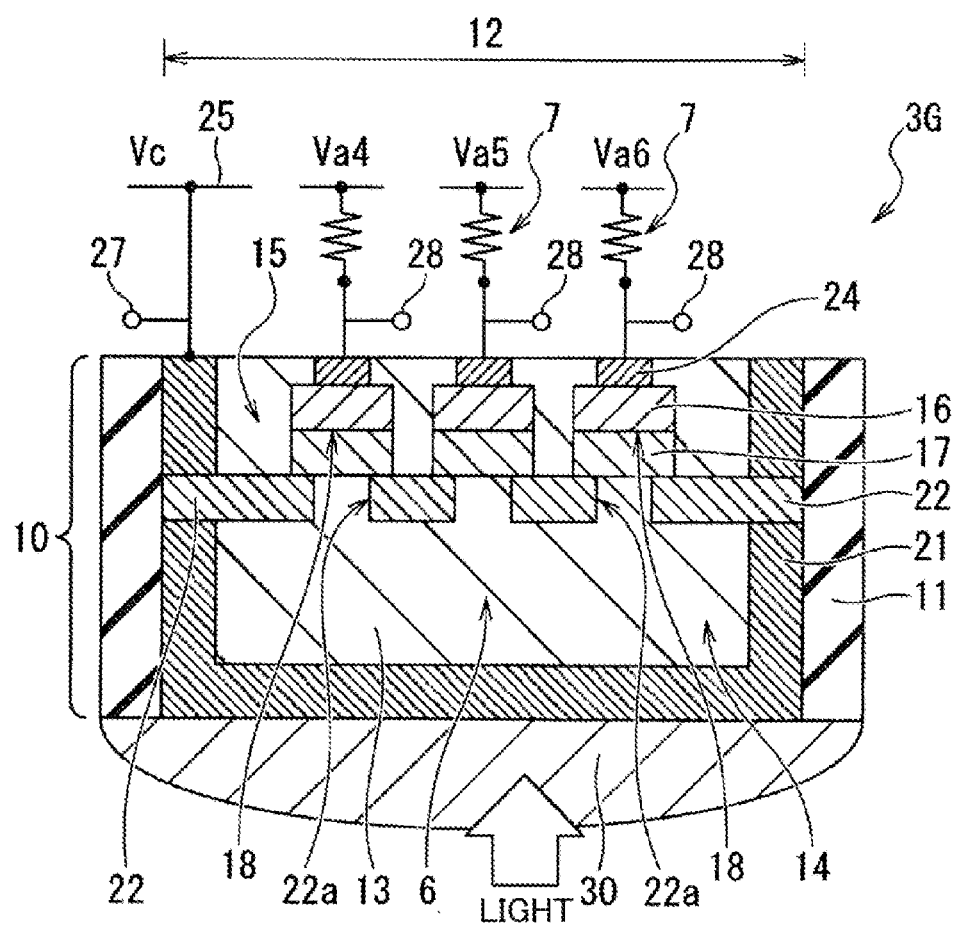
FIG. 11B is a schematic cross-sectional view showing a cross-sectional structure taken along line a11-a11 of FIG. 11A.

In the sixth embodiment and the seventh embodiment described above, the regions to be driven are separated by the wiring on the pixels. However, as shown in FIGS. 11A and 11B, the anodes are separately wired in the nine regions and connected to the anode wirings to which different voltages of Va1 to Va9 are applied. Thus, similarly to the sixth and seventh embodiments, the detection region can be arbitrarily changed according to the amount and distribution of light by controlling the respective anode voltages applied thereto. With this configuration, the detection efficiency can be changed stepwise by the number of pixel divisions (the number of scattered pn junction portions 18).

Ninth Embodiment

Figure 12A:
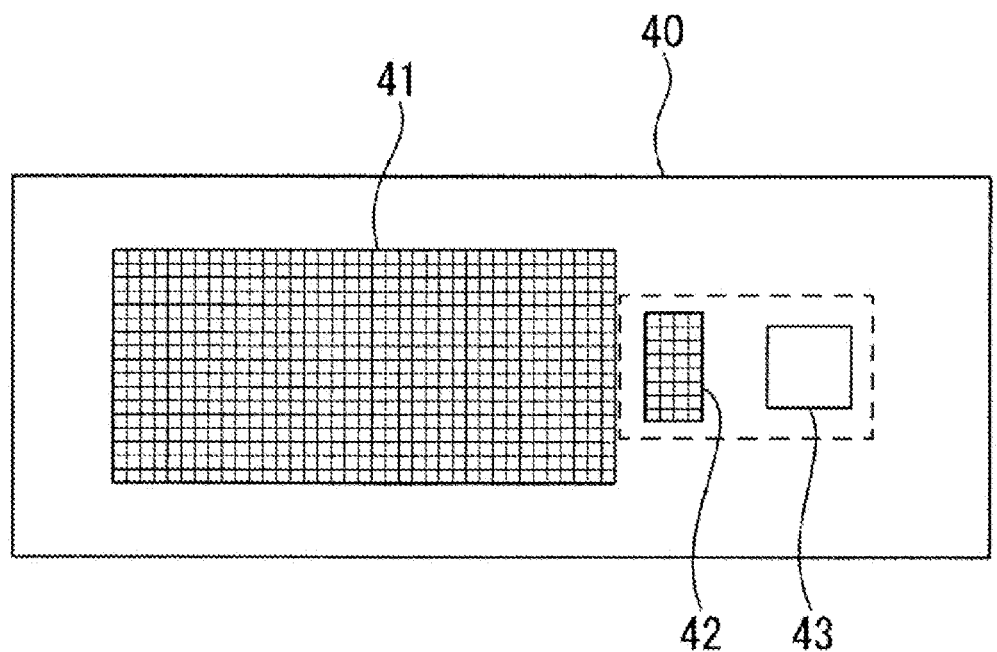
FIG. 12A is a schematic plan view showing a configuration example of a pixel chip according to a ninth embodiment of the present technology.
Figure 12B:
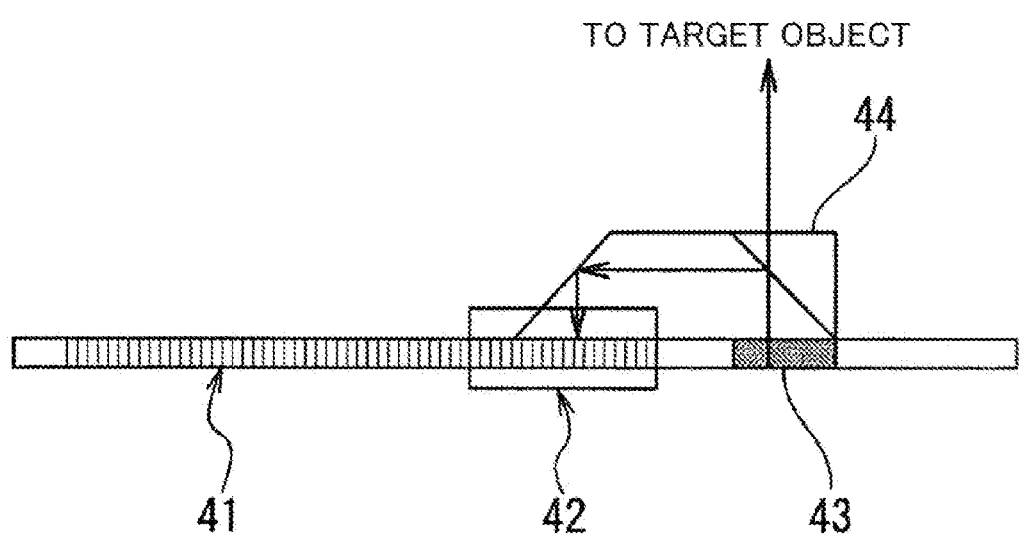
FIG. 12B is a schematic side view of a pixel chip.
Figure 12C:
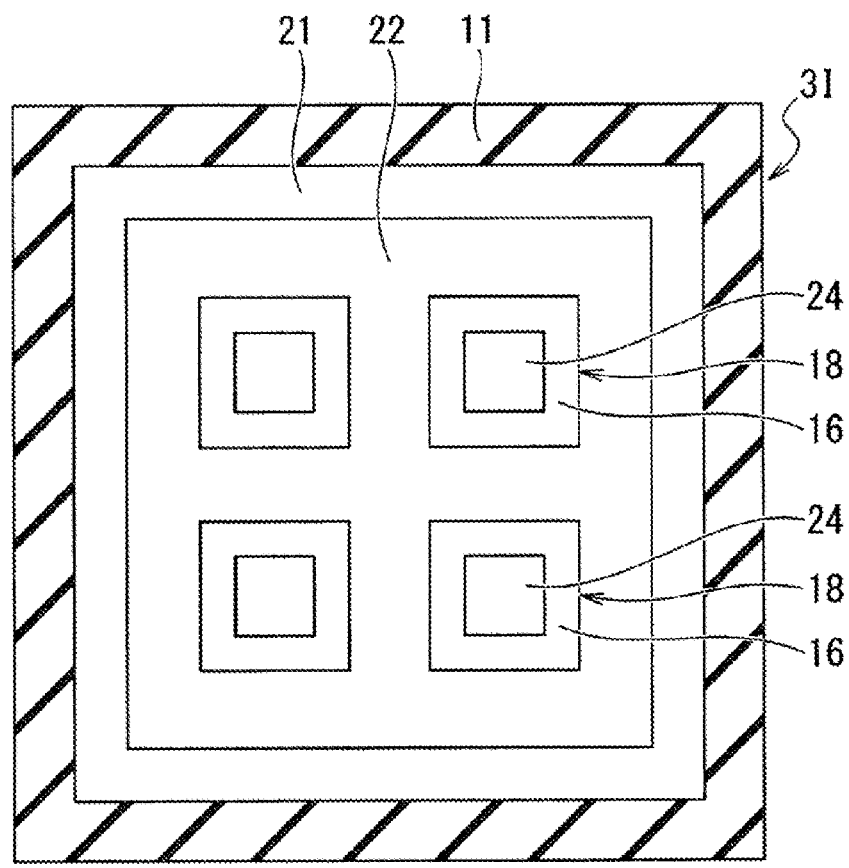
FIG. 12C is a schematic plan view showing a configuration example of a pixel constituting a light source monitor of a pixel chip.
Figure 12D:
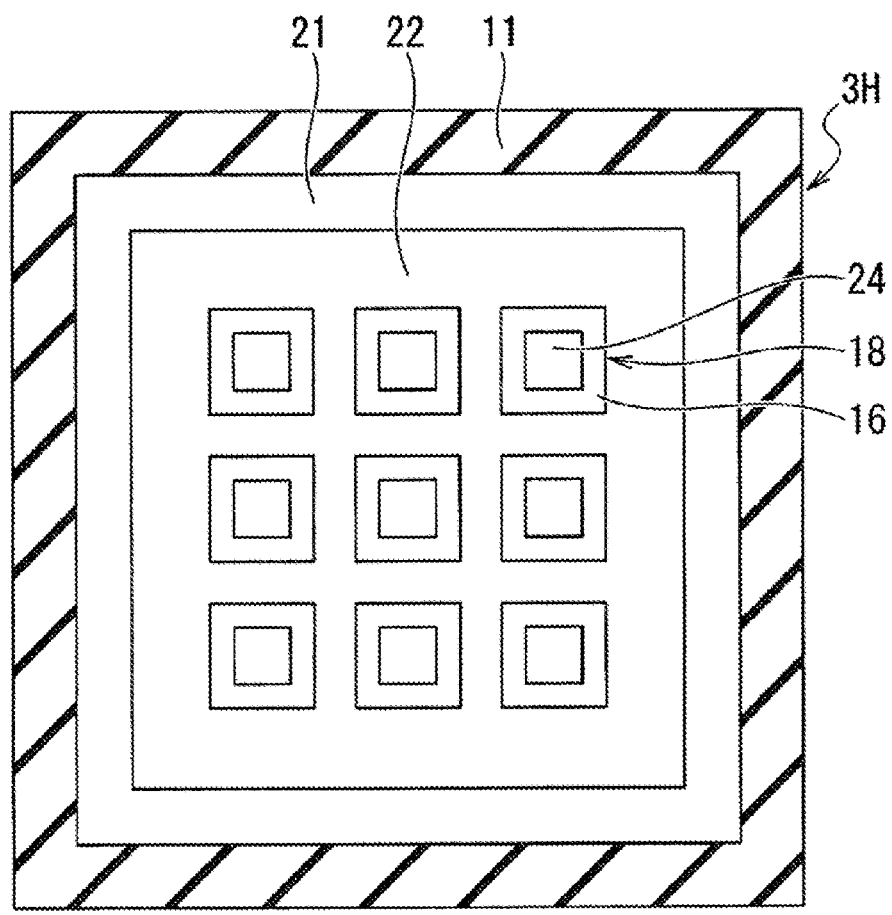
FIG. 12D is a schematic plan view showing a configuration example of pixels constituting the pixel array portion of the pixel chip.

FIGS. 12A, 12B, 12C and 12D schematically show an example of an assembly in which a pixel array portion 41, a light source monitor portion 42 and a light source 43 are arranged on a pixel chip 40 for ToF use. A pixel 3I shown in FIG. 12C is arranged in the pixel array portion 41, and a pixel 3H shown in FIG. 12D is arranged in the light source monitor portion 42. As the light source 43, a semiconductor laser, an LED, or the like is generally used. In the case of ToF use, it is necessary to monitor the emission timing of the light source pulse, so that a portion of the light source is branched and inserted into the APD element of the pixel 3H of the light source monitor portion 42 to detect the incident timing. In this example, a prism 44 is used to branch a portion of the light and allows the light to be incident on the APD element of the pixel 3H of the light source monitor portion 42.

In the ToF operation, for example, the amount of light source light may be increased when the reflected light from the ranging target object is small, and conversely, the amount of light source light may be decreased when the reflected light is large. In this case, as shown in the sixth to ninth embodiments, the detection error can be reduced by changing the light detection efficiency according to the amount of incident light. On the other hand, the pixel array portion 41 in the region for detecting the light reflected from the ranging target object does not necessarily have a configuration for changing the light detection efficiency. In this way, it is also possible to arrange pixels having different numbers of scattered pn junction portions and their wiring structures in the pixel chip 40 according to the purpose.

Tenth Embodiment

Figure 13A:
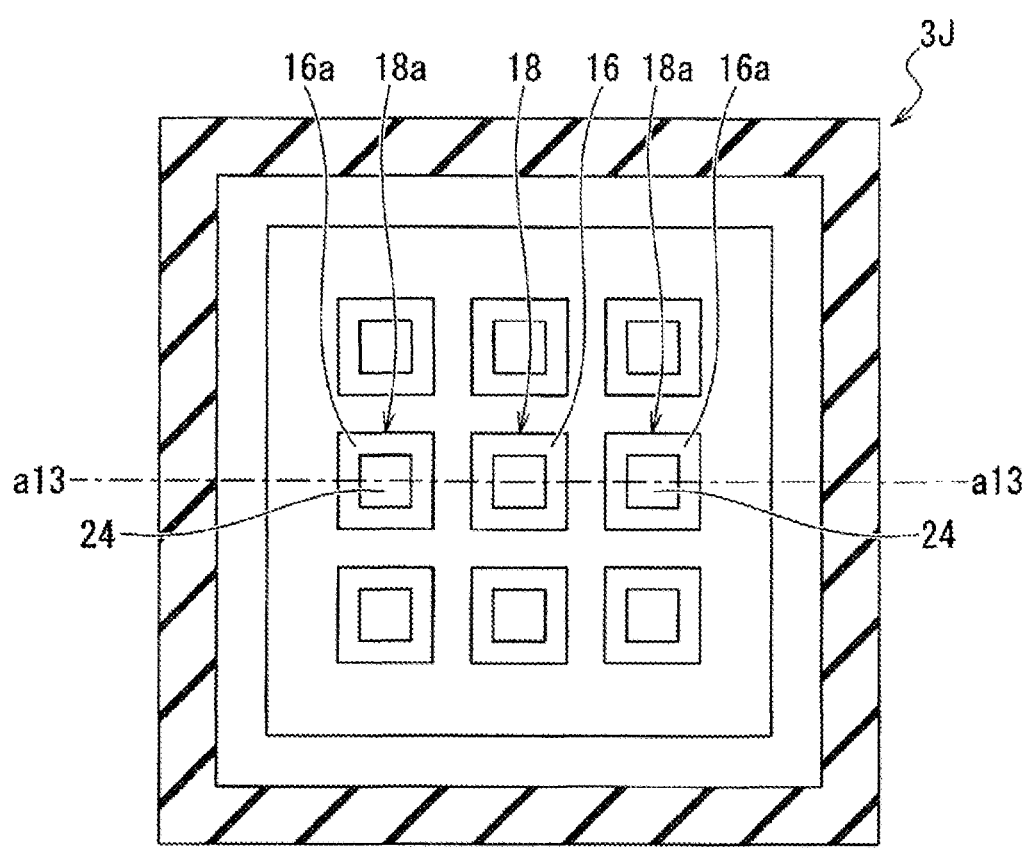
FIG. 13A is a schematic plan view showing a configuration example of a pixel according to a tenth embodiment of the present technology.
Figure 13B:
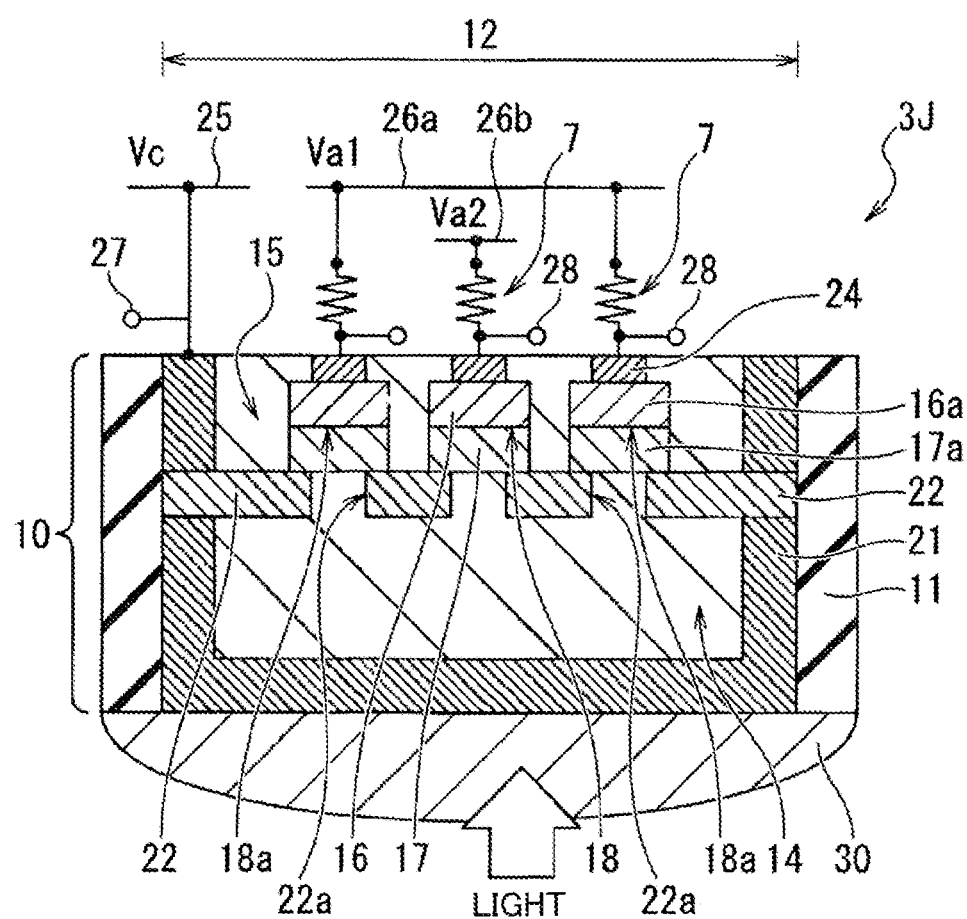
FIG. 13B is a schematic cross-sectional view showing a cross-sectional structure taken along line a13-a13 of FIG. 13A.

In this tenth embodiment, the pn junction portions scattered in one pixel are divided into a region that functions as a SPAD and a region that functions as an avalanche photodiode (APD) that is not a Geiger-mode APD by changing the implantation condition for each pn junction portion. For example, if the impurity concentration in the first semiconductor region is made thinner than the PN junction concentration in the SPAD region, the electric field in the amplification region becomes smaller and the breakdown voltage in this region becomes larger. If the applied anode-cathode voltage is not changed, it can be operated in the APD mode. That is, as shown in FIGS. 13A and 13B, the pixel 3d according to the tenth embodiment has a pn junction portion 18 in which the p-type first semiconductor region 16 and the n-type second semiconductor region 17 are bonded and a pn junction portion 18a in which a p-type first semiconductor region 16a having a lower impurity concentration than the first semiconductor region 16 and the n-type second semiconductor region 17 are bonded.

When the voltage Va2 is increased to make the anode-cathode voltage equal to or higher than the breakdown voltage in this region to put the SPAD into the ON state, a ranging signal is obtained. When the voltage Va1 is further increased to make the anode-cathode voltage equal to or lower than the breakdown voltage in this region to put the APD into the ON state, a linearly amplified optical signal can be obtained.

By performing the processing of integrating the output signal on the APD side in the period of one frame in the signal processing in the subsequent stage, the ranging signal and the image signal for each frame can be measured with the same pixel.

Eleventh Embodiment

Figure 14A:
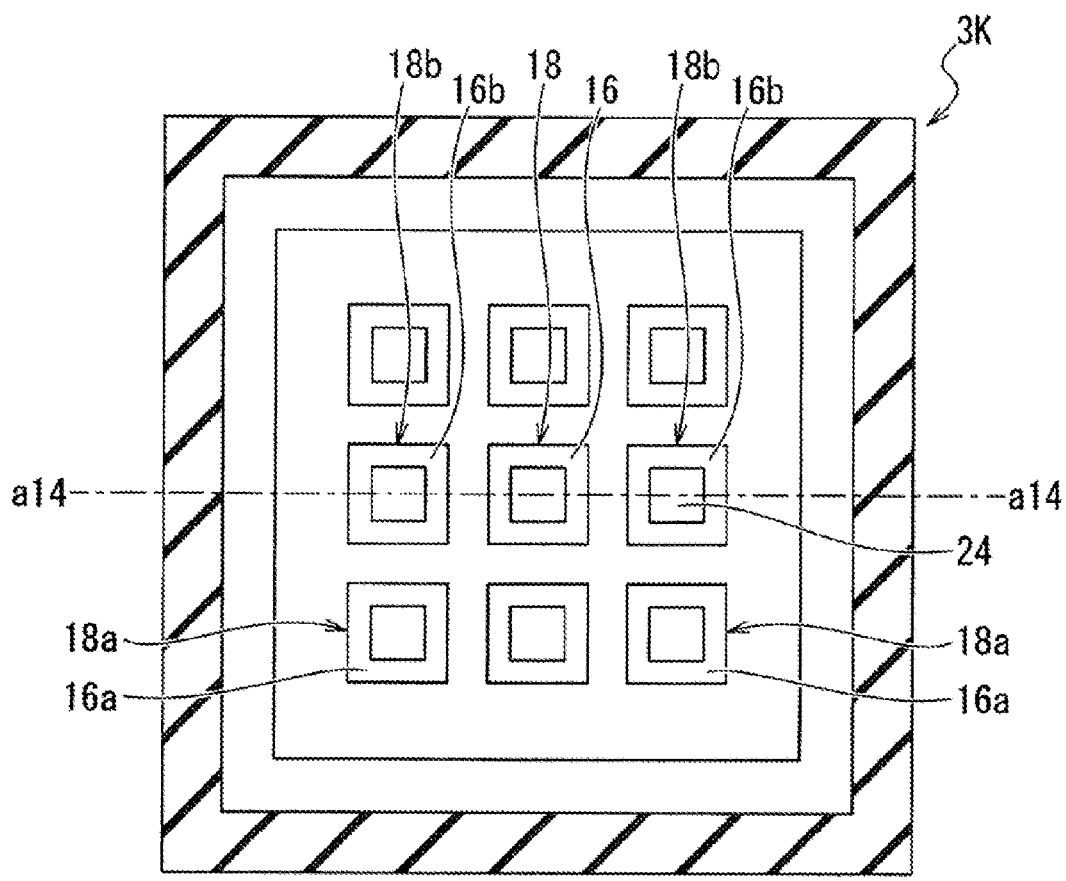
FIG. 14A is a schematic plan view showing a configuration example of a pixel according to the eleventh embodiment of the present technology.
Figure 14B:
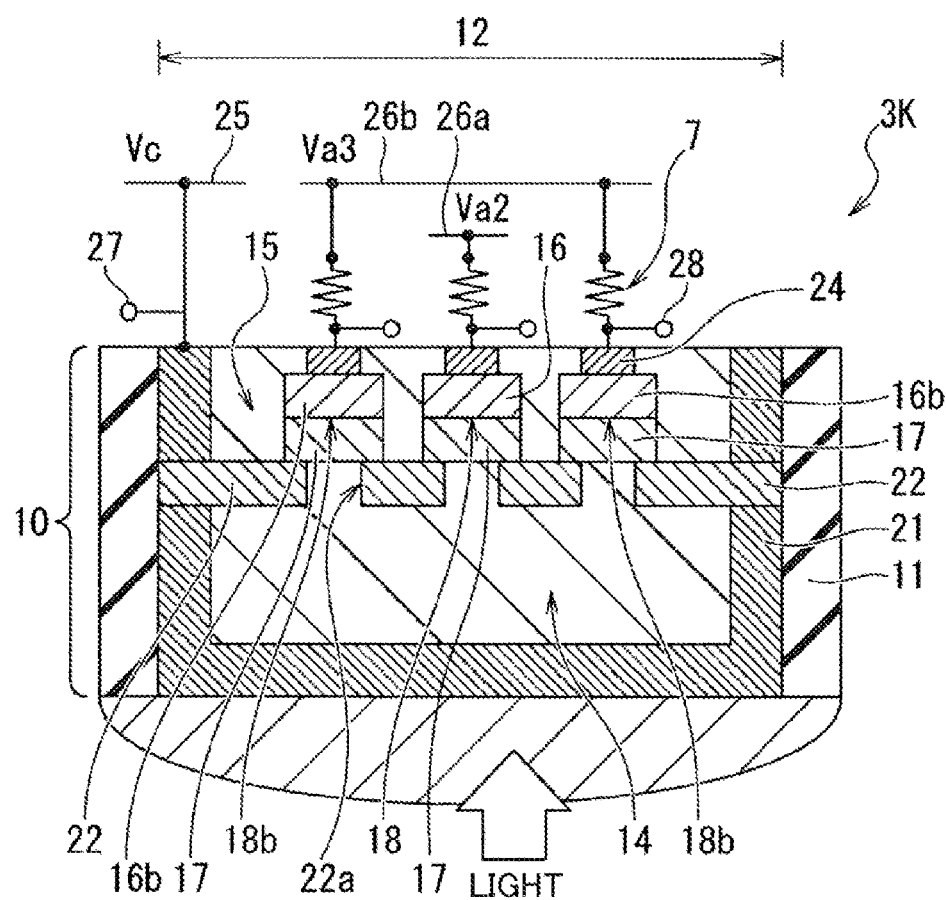
FIG. 14B is a schematic cross-sectional view showing a cross-sectional structure taken along line a14-a14 of FIG. 14A.

When the impurity concentration of the p-type first semiconductor region 16a described in the tenth embodiment is further reduced to arrange a p-type first semiconductor region 16b, a state in which the electric field at the pn junction portion becomes small and the avalanche amplification does not occur can be created. If the applied anode-cathode voltage is not changed, it can be operated with a PD (photodiode). That is, as shown in FIGS. 14A and 14B, a pixel 3K according to the eleventh embodiment has a pn junction portion 18 in which a p-type first semiconductor region 16 and an n-type second semiconductor region 17 are bonded, a pn junction portion 18a in which a p-type first semiconductor region 16a having a lower impurity concentration than the p-type first semiconductor region 16 and an n-type second semiconductor region 17 are bonded, and a pn junction portion 18b in which a p-type first semiconductor region 16b having a lower impurity concentration than the p-type first semiconductor region 16a and an n-type second semiconductor region 17 are bonded.

When the voltage Va2 is increased to put the SPAD into the ON state, a ranging signal is obtained. When the voltage Va3 is further applied, it can be operated as the PD.

Similarly to this eleventh embodiment, the ranging signal and the image signal for each frame can be measured with the same pixel by performing the processing of integrating the output signal on the PD side in the period of one frame in the signal processing of the subsequent stage.

When combined with the example of the APD of the eleventh embodiment, the operations of SPAD/APD/PD can be performed for each amplification region with the same pixel.

Twelfth Embodiment

In the tenth embodiment described above, for example, even if the SPAD in the central portion of the pixel is put into the ON state and the APD in the peripheral portion is put into the OFF state, the holes entering the APD in the peripheral portion do not contribute to amplification and the light detection efficiency is lowered. Even if the SPAD in the center of the pixel is put into the OFF state and the APD in the peripheral portion is put into the ON state, the holes entering the SPAD region in the central portion do not contribute to APD amplification, and the light detection efficiency is lowered.

Figure 15A:
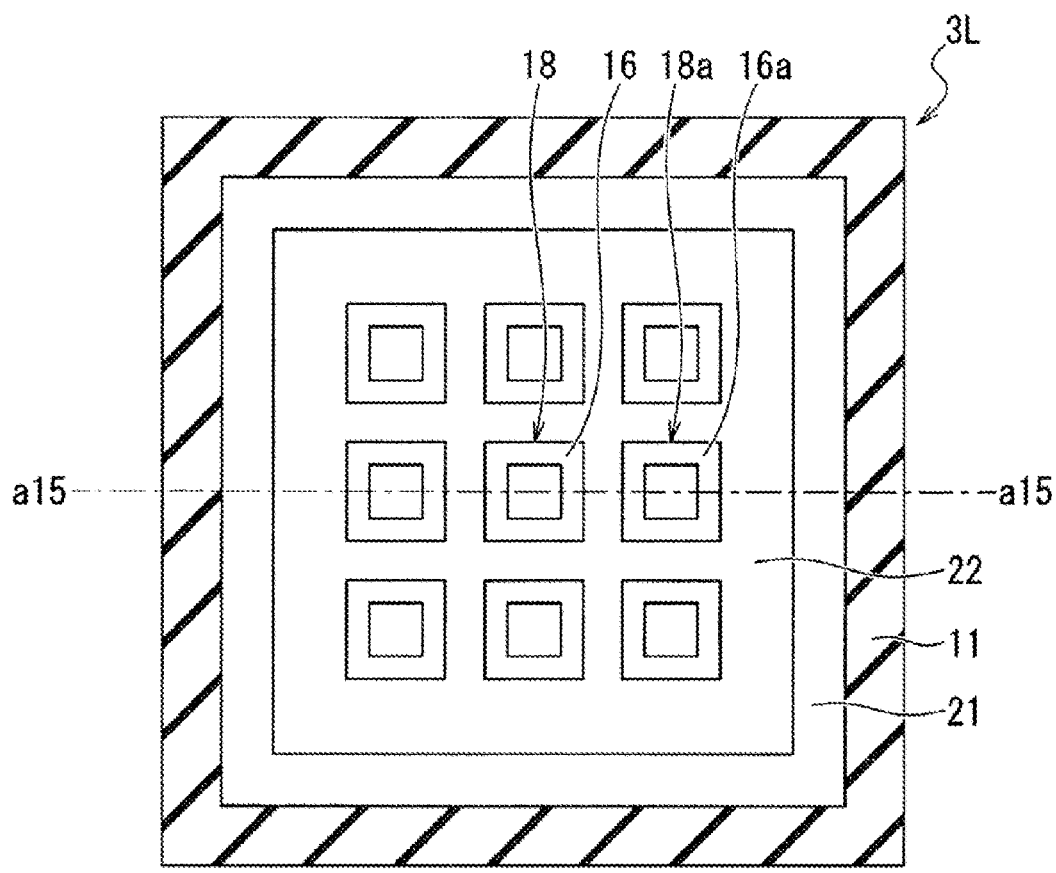
FIG. 15A is a schematic plan view showing a configuration example of a pixel according to a twelfth embodiment of the present technology.
Figure 15B:
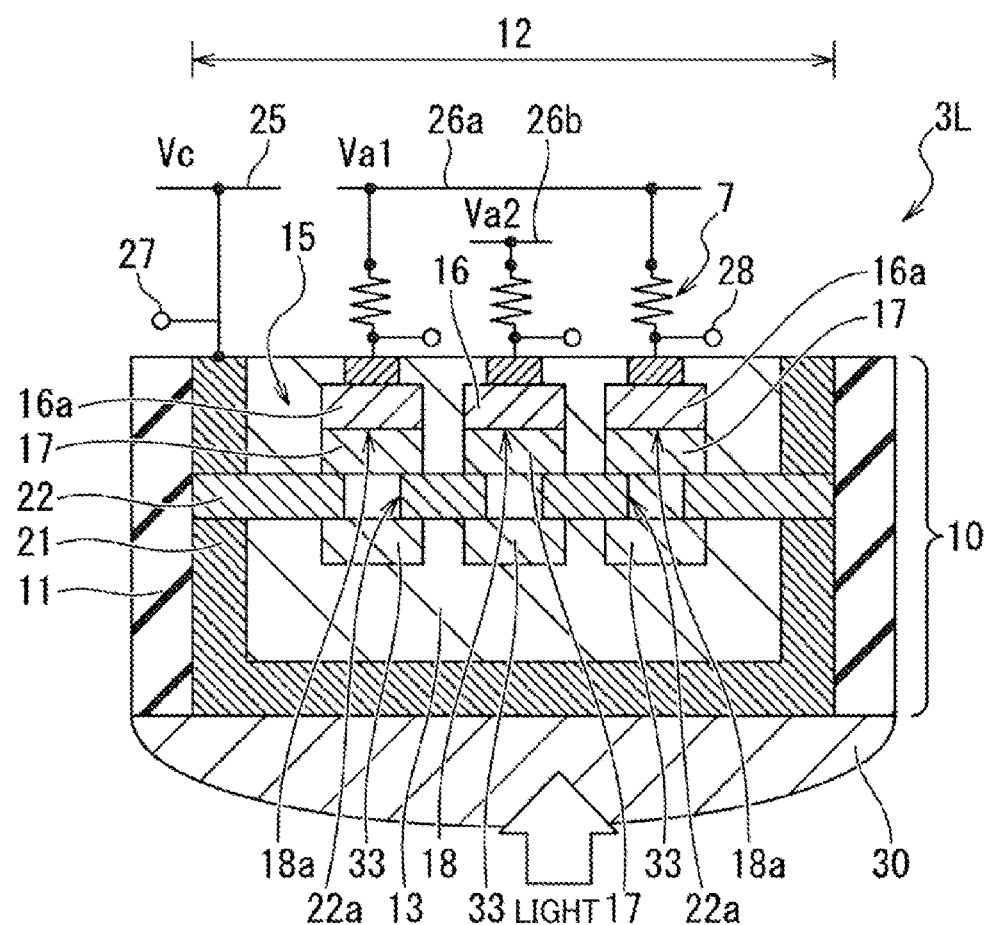
FIG. 15B is a schematic cross-sectional view showing a cross-sectional structure taken along line a15-a15 of FIG. 15A.

In order to solve such a situation, as shown in FIGS. 15A and 15B, in a pixel 3L of the twelfth embodiment, an n-type barrier region 33 having a lower impurity concentration than the n-type second semiconductor region 17 is provided immediately below the n-type second semiconductor region 17 at a position deeper than the n-type relay region 22. The impurity concentration of the n-type barrier region 33 is designed so that the potential barrier is formed when the anode-cathode voltage is lowered below the operating voltage of the APD, and the potential barrier disappears when the voltage is higher than the operating voltage.

Figure 16A:
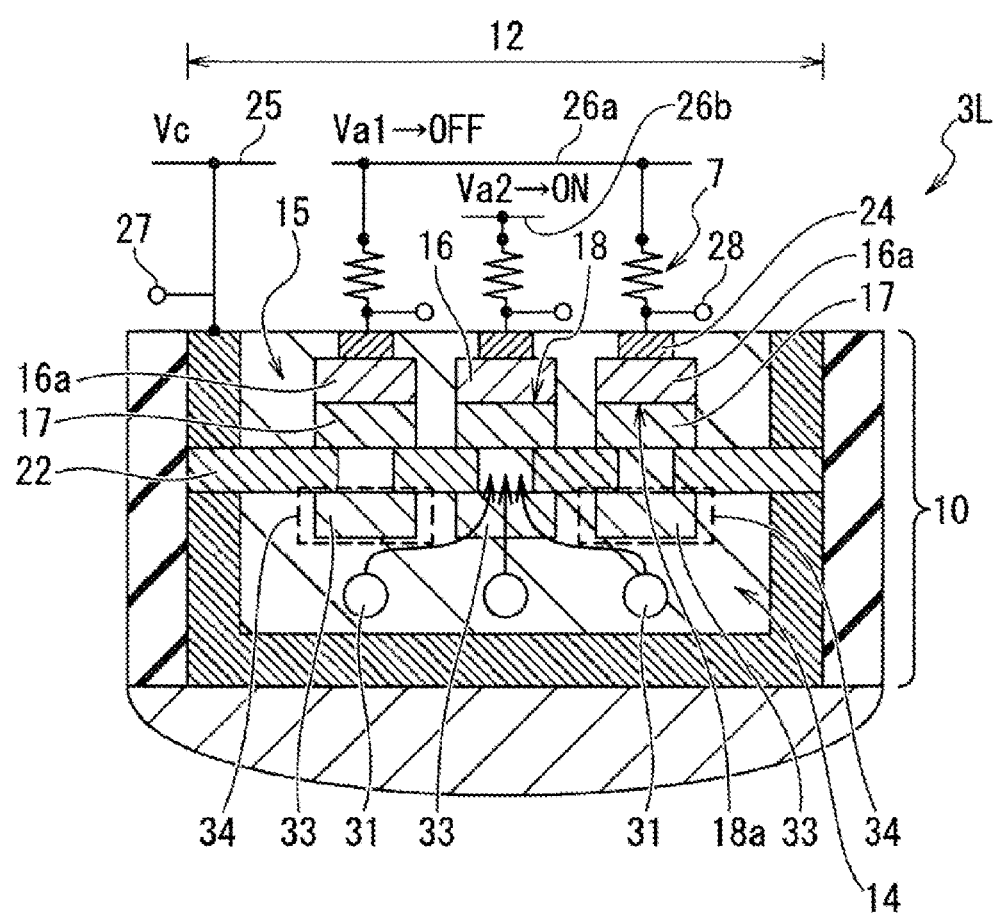
FIG. 16A is a schematic cross-sectional view showing a charge movement path.

For the pixels to operate as a SPAD, as shown in FIG. 16A, the anode voltage is lowered in the APD region including the pn junction portion 18a, and the anode-cathode voltage is reduced to the voltage at which the potential barrier 34 is formed in the n-type barrier region 33. On the other hand, the anode voltage is increased in the SPAD region including the pn junction portion 18 and the anode-cathode voltage is increased to a voltage at which the potential barrier disappears and the breakdown voltage or above. At this time, since the potential barrier 34 is formed in the n-type barrier region 33 of the APD region, the holes 31 can be guided to the SPAD region and the pixels can be operated as a SPAD. For example, the operating voltage set to Vc=15V, and Va1 and Va2 of −5 V in the ON state and 0 V in the OFF state are applied.

Figure 16B:
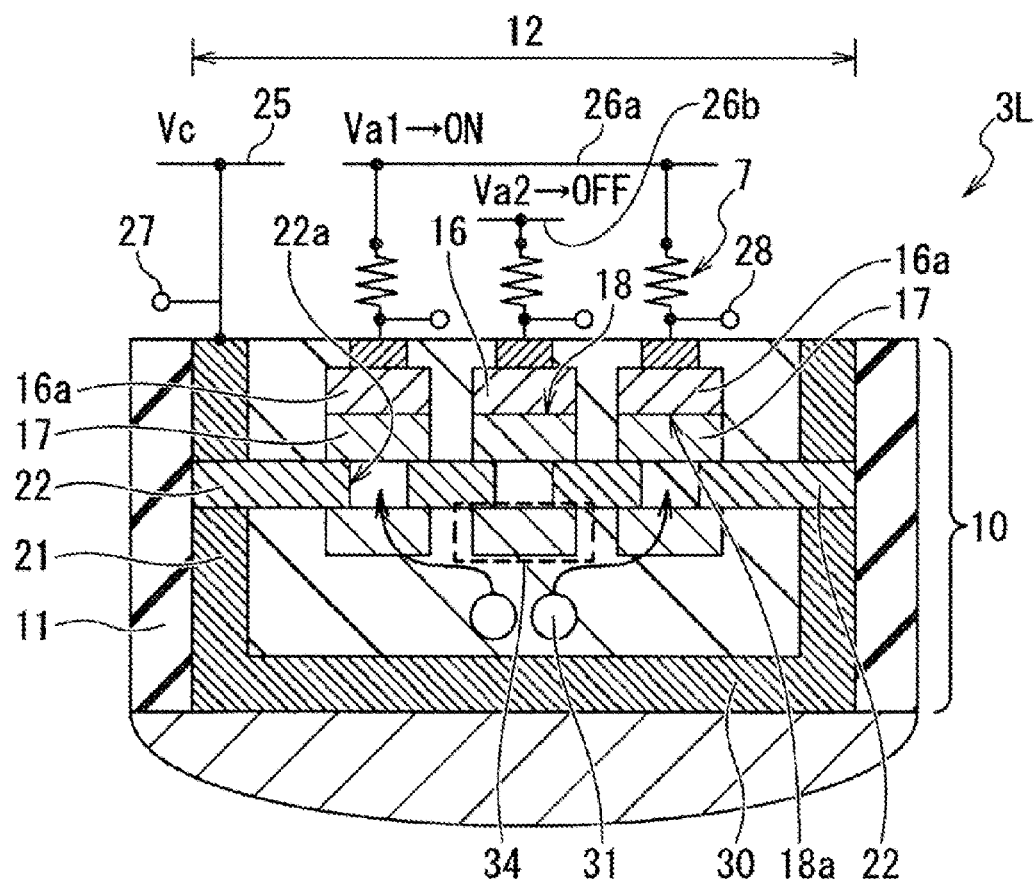
FIG. 16B is a schematic cross-sectional view showing a charge movement path.

Similarly, when the pixels operate as an APD, as shown in FIG. 16B, the anode voltage is raised in the APD region to raise the anode-cathode voltage to a voltage at which avalanche amplification occurs in the APD mode and a voltage at which the potential barrier 34 disappears. Moreover, the anode voltage is lowered in the SPAD region to lower the anode-cathode voltage to a voltage at which the potential barrier is formed. Since the potential barrier 34 is formed in the N-layer portion of the SPAD region, the holes do not go to the SPAD region and are guided to the APD region so that the pixels can be operated as an APD.

Thirteenth Embodiment

The on-chip lens 30 has a shape close to a circle when viewed from the incident surface side of light. On the other hand, it is known that when the pixel has a rectangular structure, light is likely to be lost at the pixel corner portion. Thus, it is preferable to have a hexagonal structure that is closer to a circular shape than a rectangular shape from the viewpoint of light utilization efficiency.

Figure 17A:
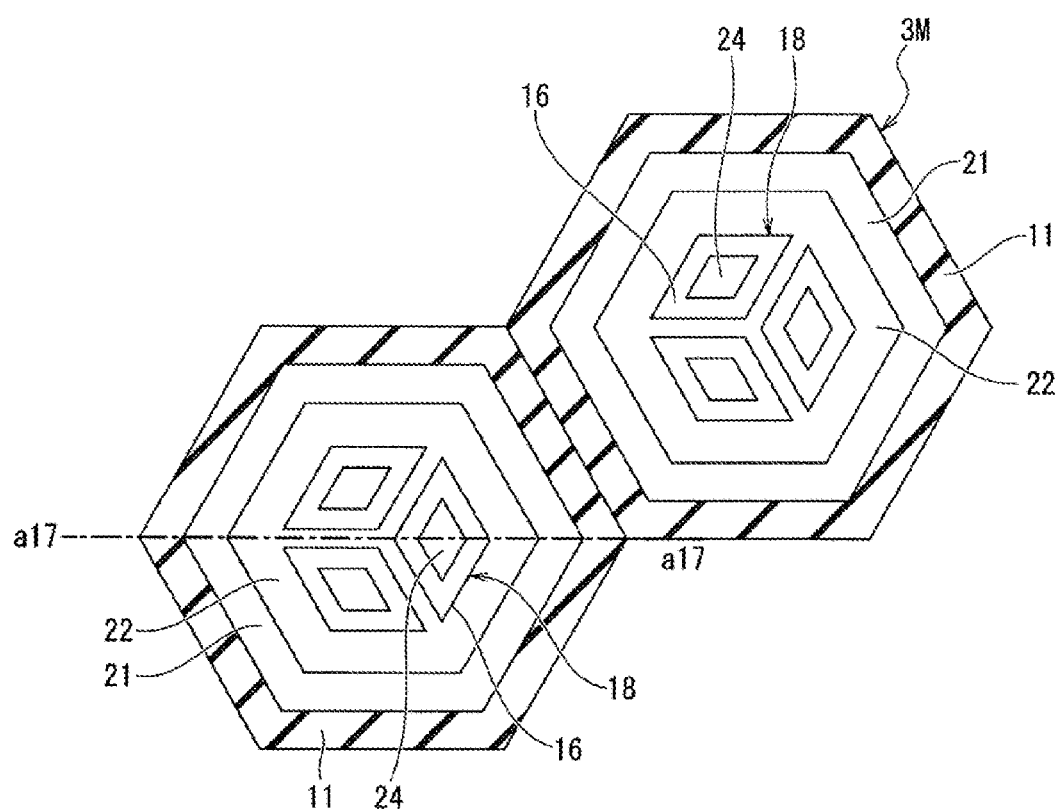
FIG. 17A is a schematic plan view showing a configuration example of a pixel according to a thirteenth embodiment of the present technology.
Figure 17B:
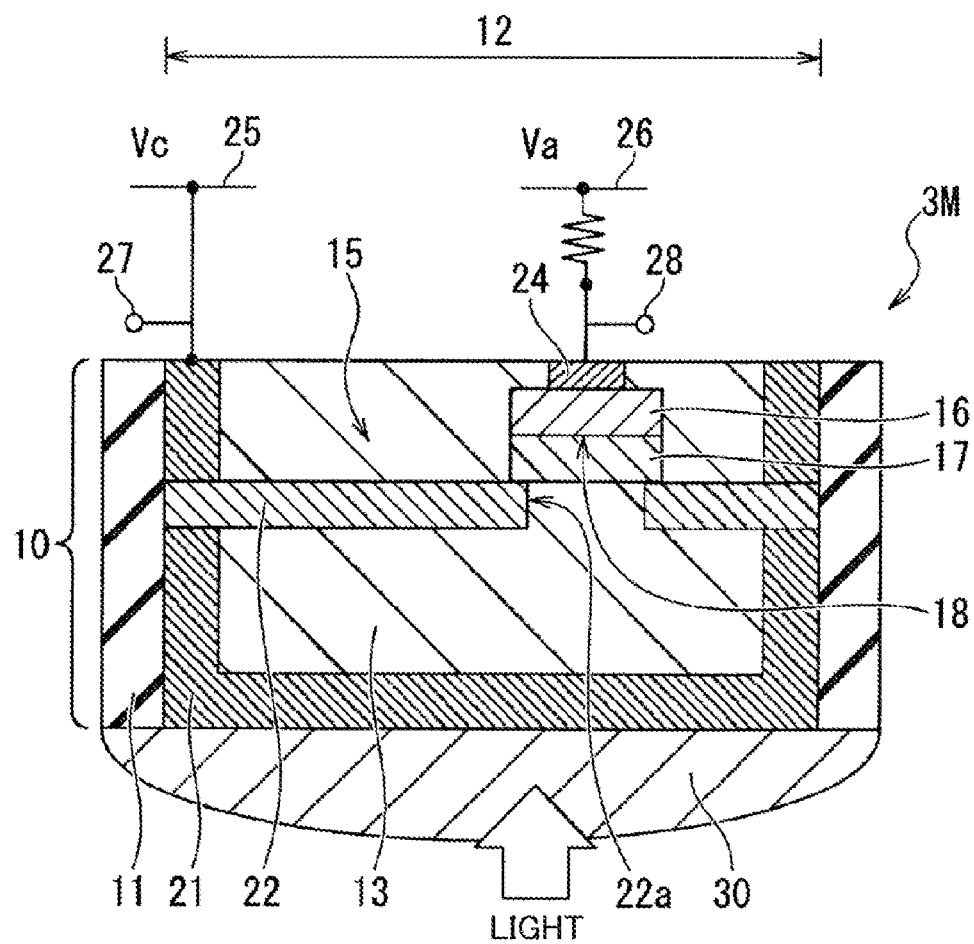
FIG. 17B is a schematic cross-sectional view showing a cross-sectional structure taken along line a17-a17 of FIG. 17A.

As shown in FIGS. 17A and 17B, a pixel 3M according to the thirteenth embodiment has a hexagonal planar pattern in a plan view. In this hexagonal pixel 3M, it is preferable to design the multiplication portion 15 in a hexagonal shape in view of light detection efficiency. However, when dividing the multiplication region, that is, when a plurality of pn junction portions 18 are scattered, in addition to the shape in which the hexagon is divided into four in the vertical and horizontal directions, as shown in FIG. 17A, a structure in which the hexagon is divided into three symmetric with respect to the center of the pixel 3M is also possible. With such a configuration, it is possible to reduce the light loss at the corners as compared with the rectangular pixel, and it is possible to increase the light detection efficiency.

Fourteenth Embodiment

Figure 18:
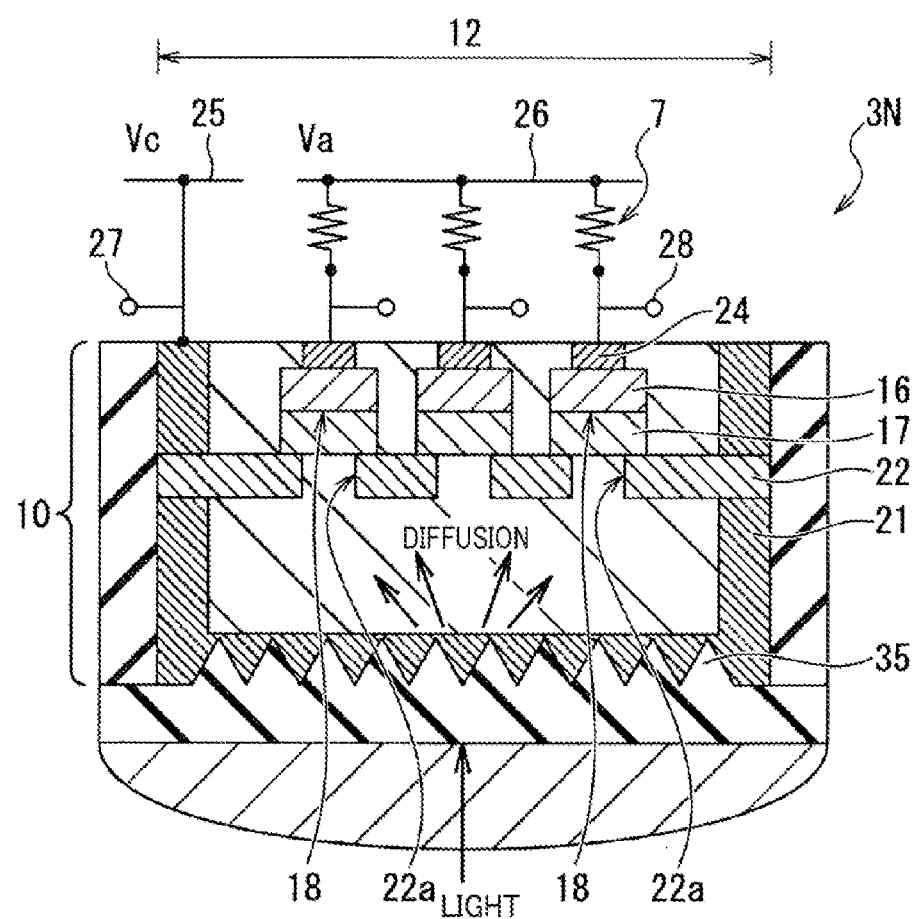
FIG. 18 is a schematic cross-sectional view showing a configuration example of a pixel according to a fourteenth embodiment of the present technology.

When the light is collected by the normal on-chip lens 30, the amount of light near the center of the pixel is high, and in the pixel in which the magnification region is divided, the light detection probability is higher in the amplification region located at the center than the other regions. As in the case of the fourth embodiment described above, considering the dead time after detecting one photon, light can be detected more efficiently when light is detected in divided regions rather than continuously detecting light in one amplification region. Thus, as shown in FIG. 18, when a diffusion structure portion 35 having an effect of diffusing light toward the light incident surface (second surface) side of a pixel 3N to diffuse the incident light, it is possible to make the amount of light entering a plurality of scattered pn junction portions 18 uniform. In this way, the light is not detected in a specific region in a biased manner, and the light can be detected efficiently. An example of the diffusion structure portion 35 that diffuses light is a moth-eye structure.

Fifteenth Embodiment

Figure 19:
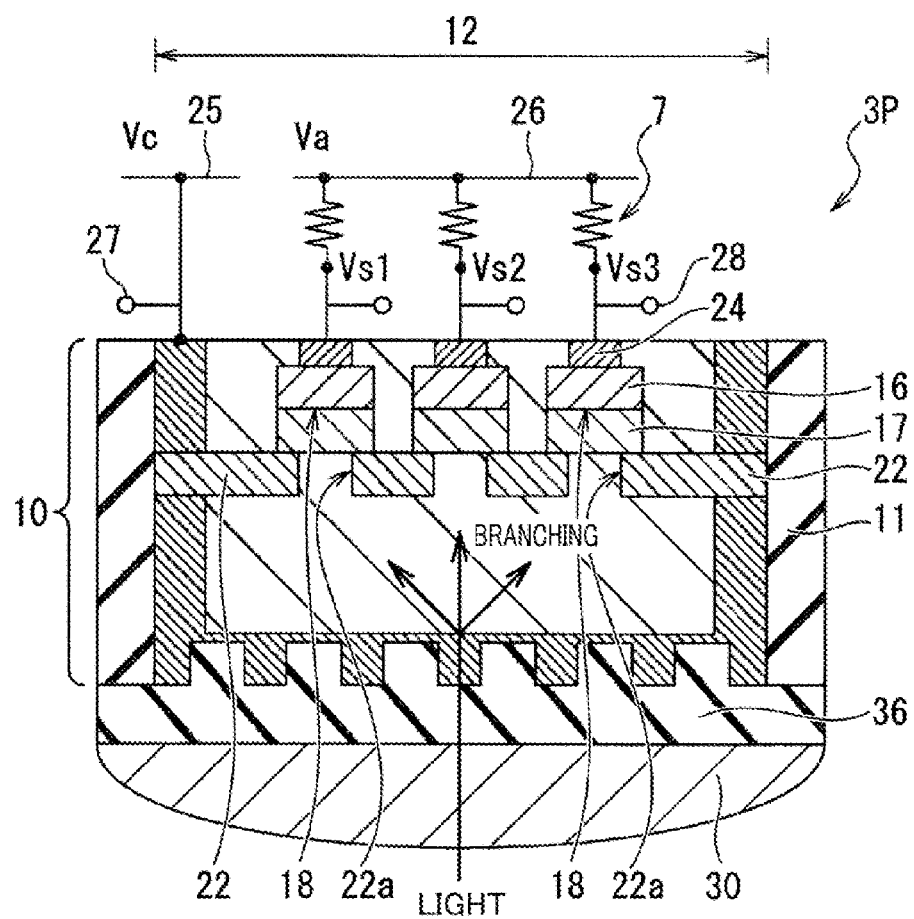
FIG. 19 is a schematic cross-sectional view showing a configuration example of a pixel according to a fifteenth embodiment of the present technology.

In the above-mentioned fourteenth embodiment, the light is diffused using the diffusion structure portion 35 on the light incident surface side, and the light is evenly incident on the divided pixels (the scattered pn junction portions 18). On the other hand, in a pixel 3P according to the fifteenth embodiment, as shown in FIG. 19, a diffraction grating structure portion 36 is provided instead of the diffusion structure portion 35 of the above-mentioned fourteenth embodiment to branch light to be incident on a plurality of scattered pn junction portions 18. In the case of the diffraction grating structure portion 36, the period, depth, and shape of the diffraction grating can be designed so that light reaches a desired place. In this way, it becomes possible to apply the light substantially evenly in the pixel 3P and, in some cases, to collect the light on a specific place, which increases the degree of freedom in design.

Sixteenth Embodiment

Figure 20A:
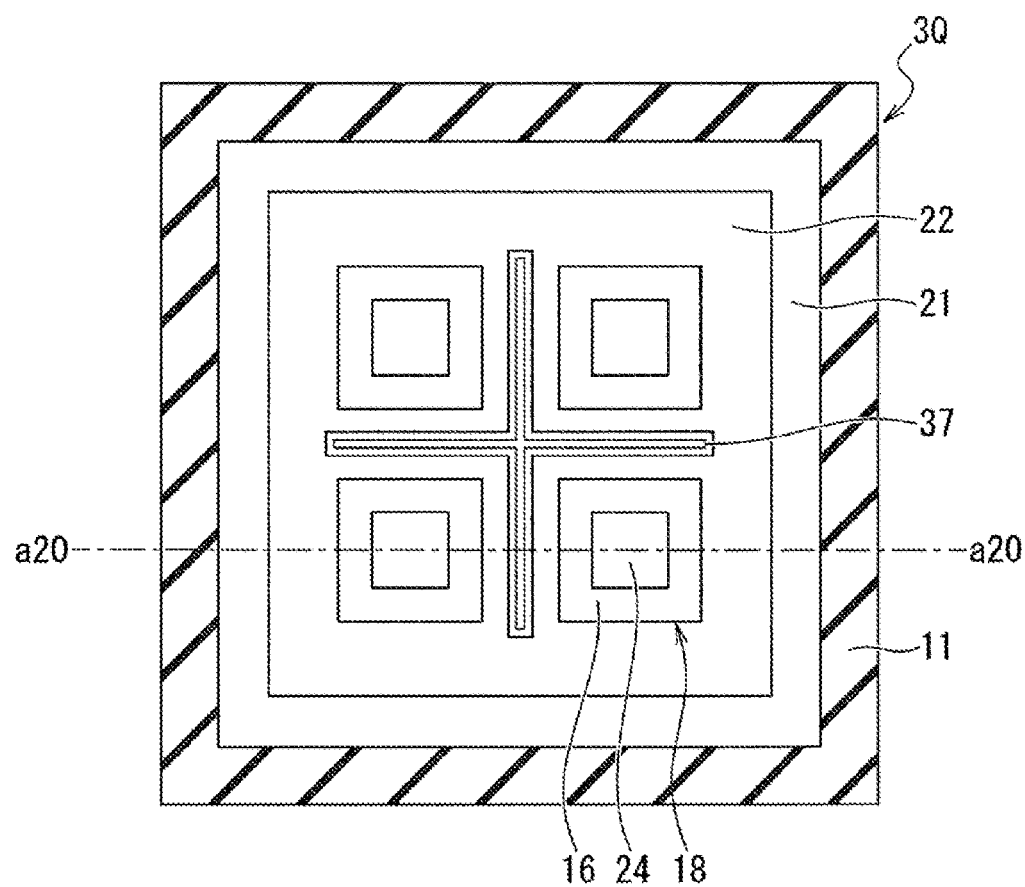
FIG. 20A is a schematic plan view showing a configuration example of a pixel according to a sixteenth embodiment of the present technology.
Figure 20B:
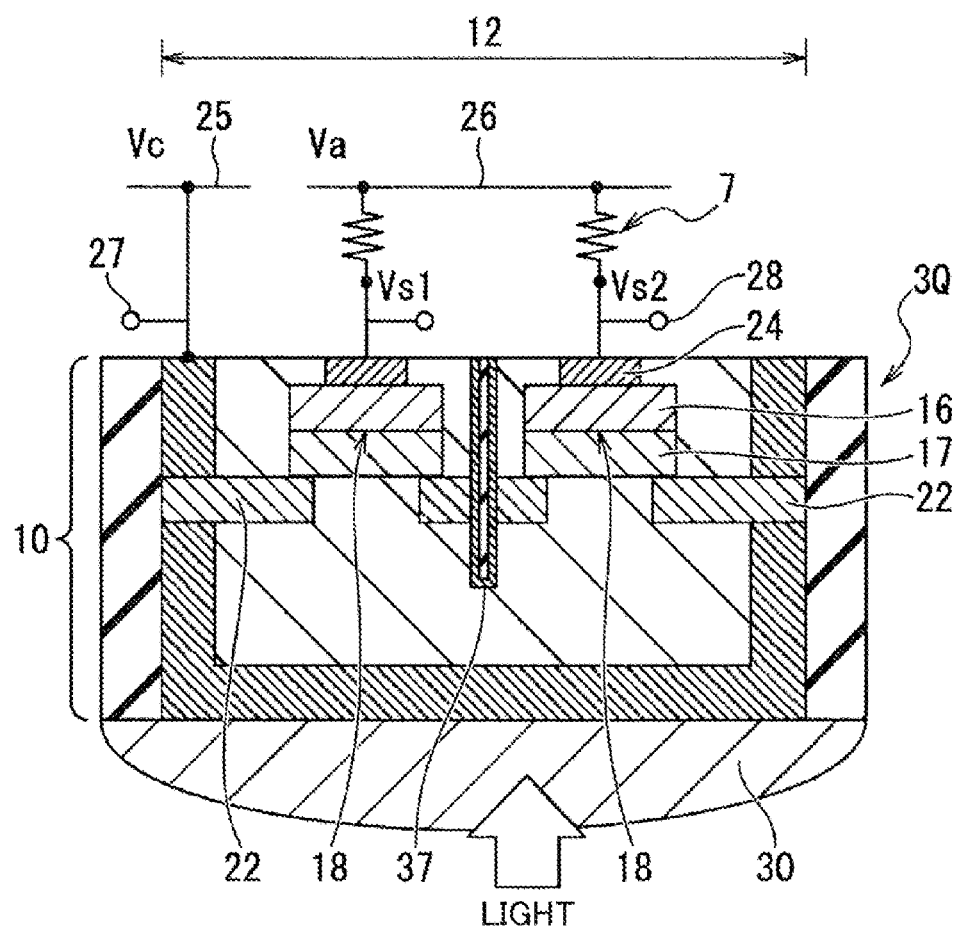
FIG. 20B is a schematic cross-sectional view showing a cross-sectional structure taken along line a20-a20 of FIG. 20A.

In normal SPAD, when the incident photon is avalanche-multiplied, the multiplication portion emits light, and the light is incident on the light absorbing portion (photoelectric conversion portion) of the adjacent pixel or own pixel, and amplification may occur using it as a seed and after-pulses may be generated. In order to reduce the after-pulses, in a pixel 3Q according to the sixteenth embodiment, a light-blocking member (DTI) 37 for blocking light is provided in a cross shape between the scattered amplification regions as shown in FIGS. 20A and 20B. The light-blocking member 37 is formed from the side opposite to the light incident surface, and a light-blocking structure is formed so as to optically separate the respective multiplication regions (the pn junction portions 18). The light-blocking member 37 has a structure in which a metal film is embedded in, for example, a silicon oxide ($SiO_2$) film. Since this phenomenon uses the magnification region as a light emitting source, if the depth is about ⅔ of the thickness of the pixel forming region 12 in the sensor substrate 10, it is possible to approximately shield the magnification region from light and to further enhance the effect of the present technology.

Seventeenth Embodiment

Figure 21A:
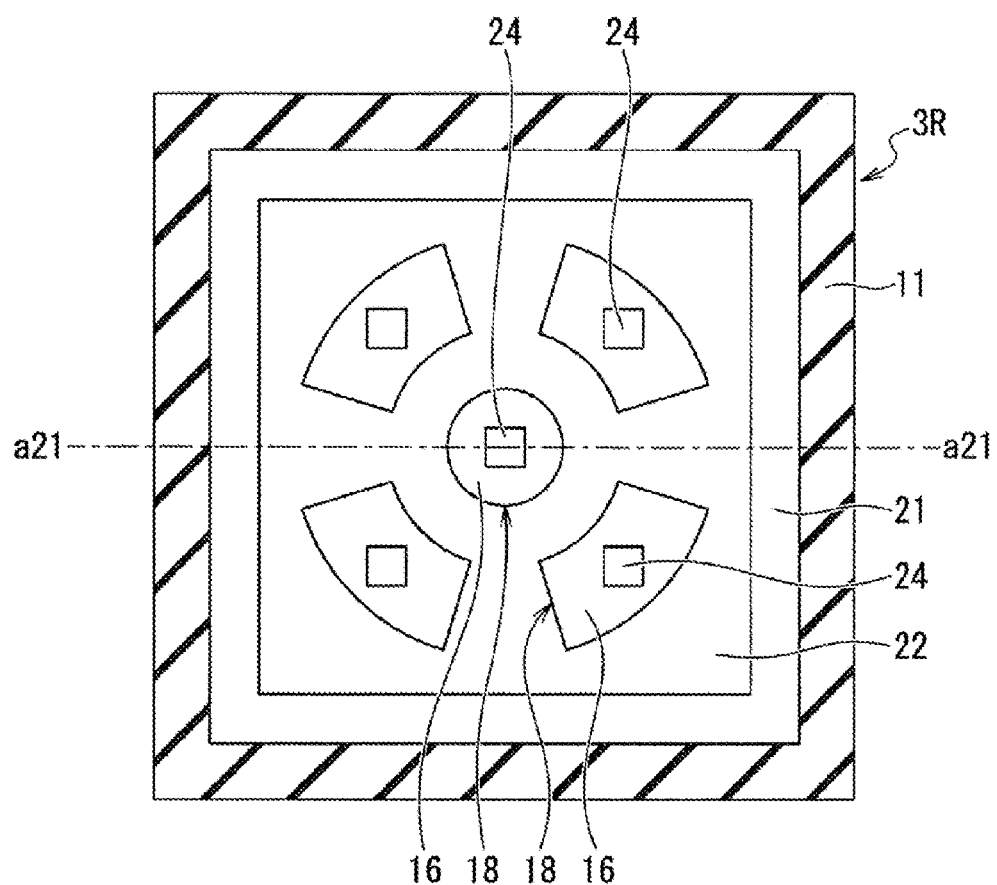
FIG. 21A is a schematic plan view showing a configuration example of a pixel according to a seventeenth embodiment of the present technology.
Figure 21B:
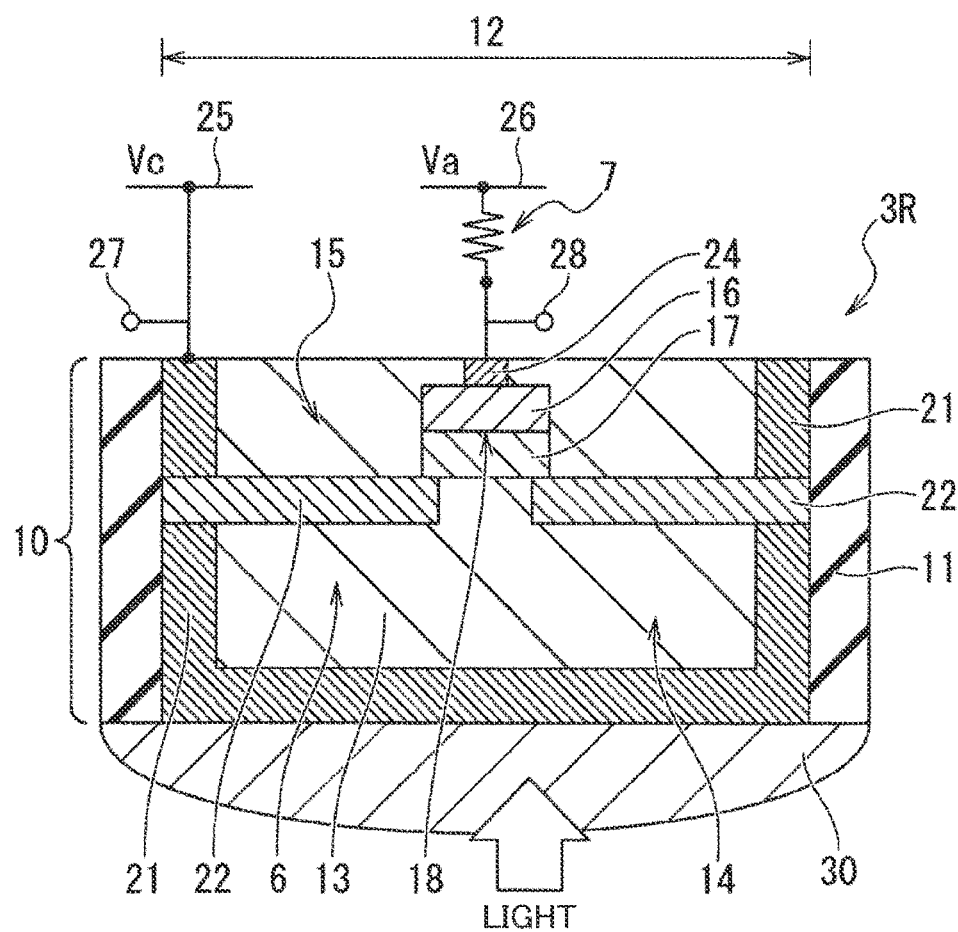
FIG. 21B is a schematic cross-sectional view showing a cross-sectional structure taken along line a20-a20 of FIG. 21A.

Until now, the rectangular pixel structure was divided into rectangles except for the hexagonal case, but it is known that this causes a large light detection loss at the pixel corners. When the on-chip lens 30 has a shape close to a circle, the collected light amount distribution also has a shape close to a concentric circle. Thus, as shown in FIGS. 21A and 21B, a pixel 3R according to the seventeenth embodiment can efficiently detect light by dividing the amplification region (the pn junction portion 18) into concentric circles and scattering them. Since the light amount distribution is stronger in the central portion of the pixel 3Q and becomes smaller toward the peripheral portion, it is preferable that the area of the central portion of the multiplication region to be divided is reduced and the area of the peripheral portion is increased. By doing so, it is possible to design a small difference in the light detection efficiency for the respective divided regions (a plurality of scattered pn junction portions 18).

Eighteenth Embodiment

In the above-mentioned first embodiment to the seventeenth embodiment, the case where the first semiconductor region 16 is composed of the p-type semiconductor region and the second semiconductor region 17 is composed of the n-type semiconductor region has been described. However, the present technology can also be applied in a configuration in which a p-type semiconductor and an n-type semiconductor are exchanged. In this case, the semiconductor region 13, the second semiconductor region 17, the charge extraction region 21, the relay region 22, the contact region 24, the barrier region 33, and the like are p-type, and the first semiconductor region 16 and the like are n-type. When the conductivity types are exchanged, they are configured to detect electrons and operate by applying a negative voltage to the anode. When the conductivity types are exchanged, the relay region 22 becomes a diffusion region of boron (B) as an impurity, and becomes the same impurity material as the P-type of the PN junction portion.

(Configuration Example of Electronic Apparatus)

Figure 22:
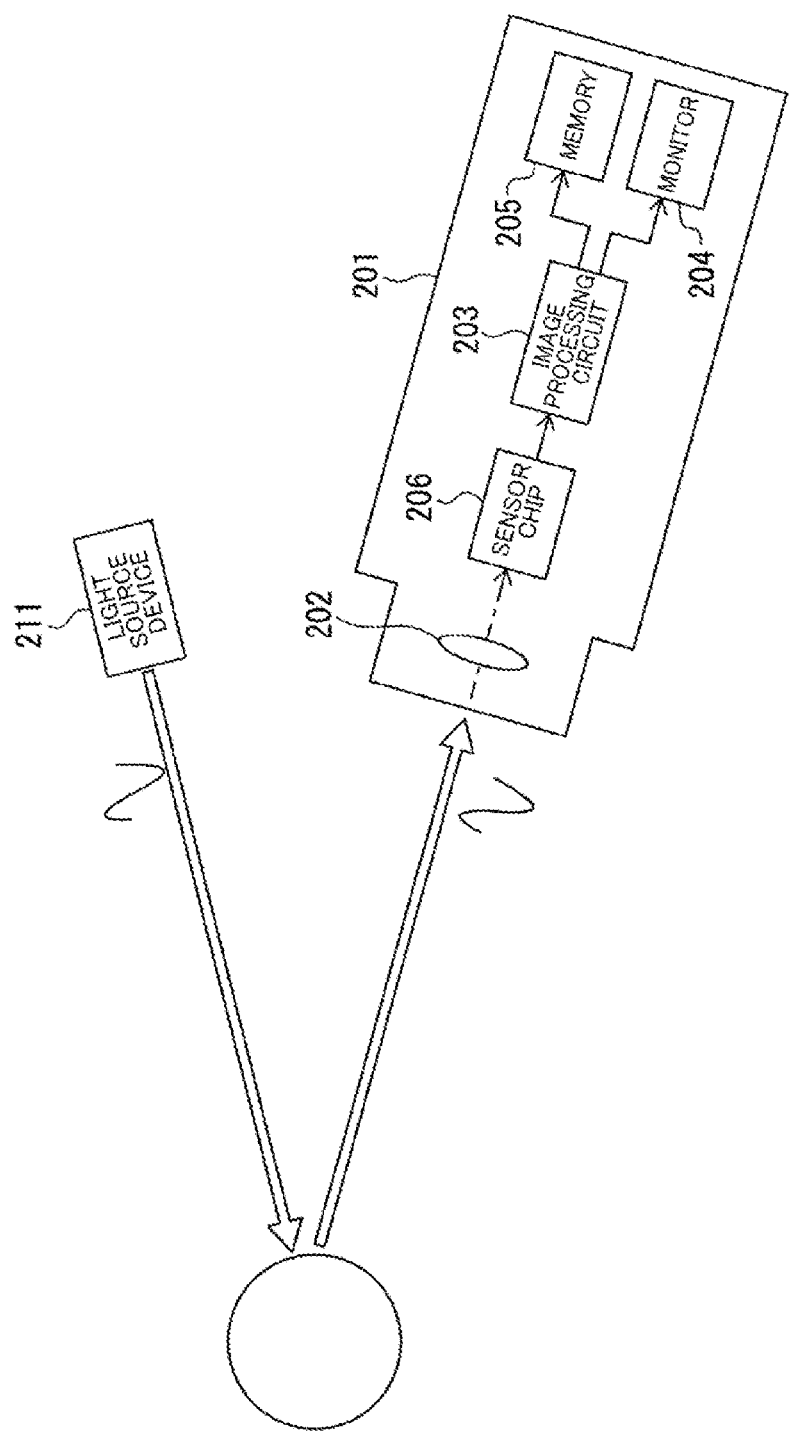
FIG. 22 is a block diagram showing a configuration example of a distance image apparatus using the sensor chip of the present technology.

As shown in FIG. 22, a distance image apparatus 201 as an electronic apparatus includes an optical system 202, a sensor chip 206, an image processing circuit 203, a monitor 204, and a memory 205. The distance image apparatus 201 can acquire a distance image according to the distance to the subject by receiving light (modulated light or pulsed light) that has been projected from a light source device 211 toward the subject and reflected on the surface of the subject.

The optical system 202 is configured to have one or a plurality of lenses, and guides the image light (incident light) from the subject to the sensor chip 206 and forms an image on the light receiving surface (sensor portion) of the sensor chip 206.

The sensor chip 2 of each of the above-described embodiments is used as the sensor chip 206, and a distance signal indicating a distance obtained from the light receiving signal (APD OUT) output from the sensor chip 2 is supplied to the image processing circuit 203.

The image processing circuit 203 performs image processing for constructing a distance image based on the distance signal supplied from the sensor chip 206, and the distance image (image data) obtained by the image processing is supplied to the monitor 204 and displayed, or is supplied to the memory 205 and stored (recorded).

In the distance image apparatus 201 configured in this way, using the sensor chip 2 described above, the distance to the subject can be calculated based only on the light receiving signals from the highly stable pixels 3, and the distance image can be generated with high accuracy. That is, the distance image apparatus 201 can acquire a more accurate distance image.

(Usage Example of Image Sensor)

The above-mentioned sensor chip 2 (image sensor) can be used in various cases for sensing light such as visible light, infrared light, ultraviolet light, and X-ray, as described below.

- Devices that capture images used for viewing, such as digital cameras and mobile apparatuses with camera functions
- Devices used for transportation, such as in-vehicle sensors that capture front, rear, surrounding, and interior view images of automobiles, monitoring cameras that monitor traveling vehicles and roads, ranging sensors that measure a distance between vehicles, and the like, for safe driving such as automatic stop, recognition of a driver's condition, and the like
- Devices used for home appliances such as TVs, refrigerators, and air conditioners in order to photograph a user's gesture and perform device operations in accordance with the gesture
- Devices used for medical treatment and healthcare, such as endoscopes and devices that perform angiography by receiving infrared light
- Devices used for security, such as monitoring cameras for crime prevention and cameras for personal authentication
- Devices used for beauty, such as a skin measuring device that captures images of the skin and a microscope that captures images of the scalp
- Devices used for sports, such as action cameras and wearable cameras for sports applications
- Devices used for agriculture, such as cameras for monitoring conditions of fields and crops Here, the present technology may have the following configurations.

(1) A semiconductor device including: a pixel array portion in which a plurality of pixels are arranged in a matrix, each of the plurality of pixels including: a pixel forming region partitioned by a separation region in a semiconductor layer; a first semiconductor region of a first conductivity type and a second semiconductor region of a second conductivity type sequentially arranged from a first surface side of the pixel forming region toward a second surface side opposite to the first surface; a pn junction portion in which the first semiconductor region and the second semiconductor region are bonded; a charge extraction region of the second conductivity type provided in a side wall of the separation region; and a relay region of the second conductivity type provided at a position deeper than the second semiconductor region so as to be connected to the charge extraction region and the second semiconductor region, wherein a plurality of the pn junction portions are scattered apart from each other, and the relay region has a higher impurity concentration than the second semiconductor region and terminates at a peripheral portion so as to surround a central portion of a surface of the second semiconductor region opposite to the pn junction portion side.

(2) The semiconductor device according to (1), wherein a plurality of the first semiconductor regions and a plurality of the second semiconductor regions are scattered to form pn junctions with each other.

(3) The semiconductor device according to (1), wherein a plurality of the first or second semiconductor regions and the second or first semiconductor region are scattered to form pn junctions.

(4) The semiconductor device according to any one of (1) to (3), wherein the relay region is composed of a semiconductor region in which arsenic is diffused as an impurity.

(5) The semiconductor device according to any one of (1) to (4), wherein the second semiconductor region is composed of a semiconductor region in which phosphorus is diffused as an impurity.

(6) The semiconductor device according to (1), wherein a plurality of the first semiconductor regions and the second semiconductor region are scattered to form pn junctions and quenching resistance elements are individually connected to the plurality of first semiconductor regions.

(7) The semiconductor device according to any one of (1) to (6), wherein an area of the pn junction portion located in the central portion of the pixel is smaller than an area of the pn junction portion located in the peripheral portion of the pixel.

(8) The semiconductor device according to any one of (1) to (7), wherein the plurality of scattered pn junction portions have a narrow width according to a light amount distribution when light enters the pixel obliquely and are arranged so as to be close to each other in an optical axis direction.

(9) The semiconductor device according to (1), wherein a plurality of the first semiconductor regions and the second semiconductor region are scattered to form pn junctions, the first semiconductor region located in the central portion of the pixel is electrically connected to a first wiring to which a first voltage is supplied via a quenching resistance element, and the first semiconductor region located in the peripheral portion of the pixel is connected to a second wiring to which a second voltage different from the first voltage is supplied.

(10) The semiconductor device according to (1), wherein a plurality of the first semiconductor regions and the second semiconductor region are scattered to form pn junctions, and the plurality of scattered first semiconductor regions include first semiconductor regions having relatively different impurity concentrations.

(11) The semiconductor device according to (1), further including: a barrier region of the second conductivity type provided immediately below the second semiconductor region at a position deeper than the relay region and having a lower impurity concentration than the second semiconductor region of the second conductivity type.

(12) An electronic apparatus including: the semiconductor device according to any one of (1) to (11): and an optical system that forms an image of image light from a subject on the second surface of the semiconductor layer.

The scope of the present technology is not limited to the illustrated and described exemplary embodiments, but includes all embodiments that provide equivalent effects sought after with the present technology. In addition, the scope of the present technology is not limited to combinations of features of the invention defined by the claims, but can be defined by any desired combination of specific features among all disclosed features.

REFERENCE SINGS LIST

1 Distance image sensor (semiconductor device)
2 Sensor chip
2A Pixel array portion
2B Peripheral portion
2C Pad arrangement portion
3, 3A to 3R Pixel
4 Electrode pad
6 APD element
7 Quenching resistance element
10 Sensor substrate (semiconductor layer)
11 Separation region
12 Pixel forming region
13 n-type semiconductor region
14 Light absorbing portion
15 Multiplication portion
16 p-type first semiconductor region
17 n-type second semiconductor region
18 pn junction portion
21 n-type charge extraction region
22 n-type relay region
23 Opening
24 p-type contact region
25 Cathode wiring
26 Anode wiring
27 Cathode terminal
28 Anode terminal
30 On-chip lens
31 Hole
32 Electron
33 n-type barrier region
34 Potential barrier
35 Diffusion structure portion
36 Diffraction grating structure portion
37 Light-blocking member
40 Pixel chip
41 Pixel array portion
42 Light source monitor portion
43 Light source

The invention claimed is:

1. A semiconductor device, comprising:
a pixel array portion that includes a plurality of pixels in a matrix,
wherein each pixel of the plurality of pixels includes:
a pixel forming region partitioned by a separation region in a semiconductor layer;
a first semiconductor region of a first conductivity type;
a second semiconductor region of a second conductivity type, wherein
the first semiconductor region and the second semiconductor region are sequentially arranged from a first surface side of the pixel forming region towards a second surface side of the pixel forming region, and
the second surface side is opposite to the first surface side;
a first pn junction portion in which the first semiconductor region is bonded to the second semiconductor region;
a charge extraction region of the second conductivity type in a side wall of the separation region; and
a relay region of the second conductivity type at a position deeper than the second semiconductor region, wherein
the relay region is connected to each of the charge extraction region and the second semiconductor region; and
a plurality of pn junction portions, wherein
the plurality of pn junction portions includes the first pn junction portion and a second pn junction portion,
the first pn junction portion is scattered apart from the second pn junction portion,
the relay region has a higher impurity concentration than the second semiconductor region,
the relay region terminates at a peripheral portion to surround a central portion of a surface of the second semiconductor region opposite to a side of the first pn junction portion, and the peripheral portion is outside of the pixel array portion.

2. The semiconductor device according to claim 1, further comprising a plurality of first semiconductor regions and a plurality of second semiconductor regions, wherein
the plurality of first semiconductor regions includes the first semiconductor region,
the plurality of second semiconductor regions includes the second semiconductor region, and
the plurality of first semiconductor regions and the plurality of second semiconductor regions are scattered to form a plurality of pn junctions.

3. The semiconductor device according to claim 1, further comprising a plurality of first semiconductor regions and a plurality of second semiconductor regions,
wherein
the plurality of first semiconductor regions includes the first semiconductor region,
the plurality of second semiconductor regions includes the second semiconductor region, and
at least one first semiconductor region of the plurality of first semiconductor regions and at least one second semiconductor region of the plurality of second semiconductor regions are scattered to form a pn junction.

4. The semiconductor device according to claim 1, wherein the relay region includes a third semiconductor region that includes arsenic as an impurity.

5. The semiconductor device according to claim 1, wherein the second semiconductor region includes phosphorus as an impurity.

6. The semiconductor device according to claim 1, further comprising:
a plurality of first semiconductor regions;
a plurality of second semiconductor regions, wherein
the plurality of first semiconductor regions includes the first semiconductor region,
the plurality of second semiconductor regions includes the second semiconductor region, and
the plurality of first semiconductor regions and the plurality of second semiconductor regions are scattered to form a plurality of pn junctions; and
a plurality of quenching resistance elements individually connected to the plurality of first semiconductor regions.

7. The semiconductor device according to claim 1, wherein
the first pn junction portion is in a central portion of each pixel of the plurality of pixels,
a third pn junction portion of the plurality of pn junction portions is in a peripheral portion of each pixel of the plurality of pixels, and
an area of the first pn junction portion is smaller than an area of the third pn junction portion.

8. The semiconductor device according to claim 1, wherein
the plurality of pn junction portions have a narrow width based on a light amount distribution of light which enters each pixel, of the plurality of pixels, obliquely, and
the first pn junction portion is within a vicinity of the second pn junction portion in an optical axis direction.

9. The semiconductor device according to claim 1, further comprising:
a plurality of first semiconductor regions; and
a plurality of second semiconductor regions, wherein
the plurality of first semiconductor regions includes the first semiconductor region,
the plurality of second semiconductor regions includes the second semiconductor region,
the plurality of first semiconductor regions and the plurality of second semiconductor regions are scattered to form a plurality of pn junctions,
the first semiconductor region in a central portion of each pixel of the plurality of pixels is electrically connected to a first wiring,
a first voltage is supplied to the first wiring via a quenching resistance element, and
the first semiconductor region in a peripheral portion of each pixel of the plurality of pixels is connected to a second wiring to which a second voltage, different from the first voltage, is supplied.

10. The semiconductor device according to claim 1, further comprising:
a plurality of first semiconductor regions; and
a plurality of second semiconductor regions, wherein
the plurality of first semiconductor regions includes the first semiconductor region,
the plurality of second semiconductor regions includes the second semiconductor region,
the plurality of first semiconductor regions and the plurality of second semiconductor regions are scattered to form a plurality of pn junctions, and
the plurality of first semiconductor regions has different impurity concentration.

11. The semiconductor device according to claim 1, further comprising a barrier region of the second conductivity type below the second semiconductor region at a position deeper than the relay region,
wherein the barrier region has a lower impurity concentration than the second semiconductor region of the second conductivity type.

12. An electronic apparatus, comprising:
a semiconductor device including:
a pixel array portion that includes a plurality of pixels in a matrix,
wherein each pixel of the plurality of pixels includes:
a pixel forming region partitioned by a separation region in a semiconductor layer;
a first semiconductor region of a first conductivity type;
a second semiconductor region of a second conductivity type, wherein
the first semiconductor region and the second semiconductor region are sequentially arranged from a first surface side of the pixel forming region towards second surface side of the pixel forming region, and
the second surface side is opposite to the first surface side;
a first pn junction portion in which the first semiconductor region is bonded to the second semiconductor region;
a charge extraction region of the second conductivity type in a side wall of the separation region; and
a relay region of the second conductivity type at a position deeper than the second semiconductor region, wherein
the relay region is connected to each of the charge extraction region and the second semiconductor region; and
a plurality of pn junction portions, wherein the plurality of pn junction portions includes the first pn junction portion and a second pn junction portion, the first pn junction portion is scattered apart from the second pn junction portion, the relay region has a higher impurity concentration than the second semiconductor region, and the relay region terminates at a peripheral portion to surround a central portion of a surface of the second semiconductor region opposite to a side of the first pn junction portion; and an optical system configured to form an image of image light from a subject on the second surface side of the semiconductor layer.

* * * * *